United States Patent
Lotfi et al.

(10) Patent No.: US 7,759,184 B2
(45) Date of Patent: *Jul. 20, 2010

(54) LATERALLY DIFFUSED METAL OXIDE SEMICONDUCTOR DEVICE AND METHOD OF FORMING THE SAME

(75) Inventors: Ashraf W. Lotfi, Bridgewater, NJ (US); Jian Tan, Bridgewater, NJ (US)

(73) Assignee: Enpirion, Inc., Hampton, NJ (US)

( * ) Notice: Subject to any disclaimer, the term of this patent is extended or adjusted under 35 U.S.C. 154(b) by 338 days.

This patent is subject to a terminal disclaimer.

(21) Appl. No.: 11/805,233

(22) Filed: May 22, 2007

(65) Prior Publication Data

US 2007/0224752 A1 Sep. 27, 2007

Related U.S. Application Data

(62) Division of application No. 10/767,684, filed on Jan. 29, 2004, now Pat. No. 7,230,302.

(51) Int. Cl.
*H01L 21/00* (2006.01)
(52) U.S. Cl. .................. 438/199; 438/200; 438/305
(58) Field of Classification Search ................ 438/199, 438/200, 305
See application file for complete search history.

(56) References Cited

U.S. PATENT DOCUMENTS

| | | | |
|---|---|---|---|
| 4,918,026 A | 4/1990 | Kosiak et al. | |
| 4,947,192 A | 8/1990 | Hawkins et al. | |
| 5,014,098 A | 5/1991 | Schlais et al. | |
| 5,029,283 A | 7/1991 | Ellsworth et al. | |
| 5,047,358 A | 9/1991 | Kosiak et al. | |
| 5,156,989 A | 10/1992 | Williams et al. | |
| 5,169,794 A | 12/1992 | Iranmanesh | |
| 5,264,782 A | 11/1993 | Newton | |
| 5,285,369 A | 2/1994 | Balakrishnan | |
| 5,321,319 A | 6/1994 | Mahmood | |
| 5,366,916 A | 11/1994 | Summe et al. | |
| 5,405,791 A * | 4/1995 | Ahmad et al. | 438/228 |
| 5,469,334 A | 11/1995 | Balakrishnan | |
| 5,485,027 A | 1/1996 | Williams et al. | |
| 5,492,847 A * | 2/1996 | Kao et al. | 438/302 |

(Continued)

OTHER PUBLICATIONS

Betancourt-Zamora, R.J. et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

(Continued)

*Primary Examiner*—Laura M Menz
(74) *Attorney, Agent, or Firm*—Slater & Matsil, L.L.P.

(57) ABSTRACT

A transistor advantageously embodied in a laterally diffused metal oxide semiconductor device having a gate located over a channel region recessed into a semiconductor substrate and a method of forming the same. In one embodiment, the laterally diffused metal oxide semiconductor device includes a source/drain having a lightly doped region located adjacent the channel region and a heavily doped region located adjacent the lightly doped region. The laterally diffused metal oxide semiconductor device further includes an oppositely doped well located under and within the channel region, and a doped region, located between the heavily doped region and the oppositely doped well, having a doping concentration profile less than a doping concentration profile of the heavily doped region.

10 Claims, 14 Drawing Sheets

U.S. PATENT DOCUMENTS

| | | | |
|---|---|---|---|
| 5,504,450 A | 4/1996 | McPartland | |
| 5,610,421 A | 3/1997 | Contiero et al. | |
| 5,644,266 A | 7/1997 | Chen et al. | |
| 5,668,024 A * | 9/1997 | Tsai et al. | 438/199 |
| 5,710,054 A | 1/1998 | Gardner et al. | |
| 5,757,045 A * | 5/1998 | Tsai et al. | 257/336 |
| 5,859,606 A | 1/1999 | Schrader et al. | |
| 5,888,861 A | 3/1999 | Chien et al. | |
| 5,889,315 A | 3/1999 | Farrenkopf et al. | |
| 5,899,732 A * | 5/1999 | Gardner et al. | 438/473 |
| 5,930,642 A * | 7/1999 | Moore et al. | 438/407 |
| 5,982,645 A | 11/1999 | Levran et al. | |
| 6,005,377 A | 12/1999 | Chen et al. | |
| 6,118,351 A | 9/2000 | Kossives et al. | |
| 6,204,542 B1 | 3/2001 | Kinoshita et al. | |
| 6,255,714 B1 | 7/2001 | Kossives et al. | |
| 6,271,063 B1 | 8/2001 | Chan et al. | |
| 6,288,424 B1 | 9/2001 | Ludikhuize | |
| 6,297,108 B1 | 10/2001 | Chu | |
| 6,380,004 B2 | 4/2002 | Boden, Jr. et al. | |
| 6,384,447 B2 | 5/2002 | Mihnea et al. | |
| 6,384,643 B1 | 5/2002 | Grose et al. | |
| 6,392,275 B1 | 5/2002 | Jang | |
| 6,413,806 B1 | 7/2002 | Sicard et al. | |
| 6,420,771 B2 | 7/2002 | Gregory | |
| 6,495,019 B1 | 12/2002 | Filas et al. | |
| 6,521,960 B2 | 2/2003 | Lee | |
| 6,541,819 B2 | 4/2003 | Lotfi et al. | |
| 6,545,360 B1 | 4/2003 | Ohkubo et al. | |
| 6,551,871 B2 | 4/2003 | Takamura | |
| 6,653,174 B1 | 11/2003 | Cho et al. | |
| 6,744,676 B2 | 6/2004 | Leung et al. | |
| 6,765,272 B2 | 7/2004 | Natsume | |
| 6,833,585 B2 | 12/2004 | Kim et al. | |
| 6,855,985 B2 | 2/2005 | Williams et al. | |
| 6,873,017 B2 | 3/2005 | Cai et al. | |
| 6,900,101 B2 | 5/2005 | Lin | |
| 6,911,694 B2 | 6/2005 | Negoro et al. | |
| 6,960,512 B2 * | 11/2005 | Cheng et al. | 438/305 |
| 7,012,792 B2 | 3/2006 | Yoshida | |
| 7,015,544 B2 * | 3/2006 | Lotfi et al. | 257/336 |
| 7,019,505 B2 | 3/2006 | Dwarakanath et al. | |
| 7,038,438 B2 | 5/2006 | Dwarakanath et al. | |
| 7,074,684 B2 * | 7/2006 | Roy et al. | 438/300 |
| 7,129,143 B2 * | 10/2006 | Park | 438/305 |
| 7,186,606 B2 * | 3/2007 | Lotfi et al. | 438/200 |
| 7,190,026 B2 * | 3/2007 | Lotfi et al. | 257/336 |
| 7,195,981 B2 * | 3/2007 | Lotfi et al. | 438/289 |
| 7,211,516 B2 * | 5/2007 | Chen et al | 438/682 |
| 7,214,985 B2 * | 5/2007 | Lotfi et al. | 257/336 |
| 7,229,886 B2 * | 6/2007 | Lotfi et al. | 438/305 |
| 7,230,302 B2 * | 6/2007 | Lotfi et al. | 257/369 |
| 7,232,733 B2 * | 6/2007 | Lotfi et al. | 438/332 |
| 7,232,762 B2 * | 6/2007 | Chang et al. | 438/694 |
| 7,244,994 B2 * | 7/2007 | Lotfi et al. | 257/369 |
| 7,256,674 B2 * | 8/2007 | Lotfi et al. | 336/90 |
| 7,276,998 B2 * | 10/2007 | Lotfi et al. | 336/90 |
| 7,330,017 B2 | 2/2008 | Dwarakanath et al. | |
| 7,335,948 B2 * | 2/2008 | Lotfi et al. | 257/338 |
| 7,344,985 B2 * | 3/2008 | Chen et al. | 438/682 |
| 7,355,255 B2 * | 4/2008 | Chen et al. | 257/388 |
| 7,364,957 B2 * | 4/2008 | Thei et al. | 438/197 |
| 7,422,967 B2 * | 9/2008 | DeLoach et al. | 438/513 |
| 7,422,968 B2 * | 9/2008 | Lu et al. | 438/528 |
| 7,426,780 B2 * | 9/2008 | Lotfi et al. | 29/602.1 |
| 7,462,317 B2 * | 12/2008 | Lotfi et al. | 264/272.16 |
| 7,511,350 B2 * | 3/2009 | Chen et al. | 257/412 |
| 7,521,907 B2 * | 4/2009 | Cervera et al. | 323/268 |
| 7,544,995 B2 * | 6/2009 | Lotfi et al. | 257/335 |
| 2004/0094806 A1 | 5/2004 | Schillaci et al. | |
| 2004/0227190 A1 | 11/2004 | Cai et al. | |
| 2005/0168203 A1 | 8/2005 | Dwarakanath et al. | |
| 2005/0168205 A1 | 8/2005 | Dwarakanath et al. | |
| 2005/0169024 A1 | 8/2005 | Dwarakanath et al. | |
| 2005/0179084 A1 | 8/2005 | Robb et al. | |
| 2006/0027864 A1 | 2/2006 | Negoro et al. | |
| 2006/0038225 A1 | 2/2006 | Lotfi et al. | |
| 2006/0038237 A1 | 2/2006 | Lotfi et al. | |
| 2006/0038238 A1 | 2/2006 | Lotfi et al. | |
| 2006/0039224 A1 | 2/2006 | Lotfi et al. | |
| 2006/0040441 A1 | 2/2006 | Lotfi et al. | |
| 2006/0040449 A1 | 2/2006 | Lotfi et al. | |
| 2006/0040451 A1 | 2/2006 | Lotfi et al. | |
| 2006/0040452 A1 | 2/2006 | Lotfi et al. | |
| 2006/0081937 A1 | 4/2006 | Lotfi et al. | |
| 2007/0224752 A1 * | 9/2007 | Lotfi et al. | 438/199 |
| 2007/0284658 A1 * | 12/2007 | Lotfi et al. | 257/338 |
| 2008/0301929 A1 * | 12/2008 | Lotfi et al. | 29/602.1 |
| 2009/0065964 A1 * | 3/2009 | Lotfi et al. | 264/104 |
| 2009/0167267 A1 * | 7/2009 | Dwarakanath et al. | 323/282 |
| 2009/0212751 A1 * | 8/2009 | Cervera et al. | 323/268 |
| 2009/0261791 A1 * | 10/2009 | Lopata et al. | 323/282 |
| 2010/0044789 A1 * | 2/2010 | Lotfi et al. | 257/336 |

OTHER PUBLICATIONS

Goodman, J. et al., "An Energy/Security Scalable Encryption Processor Using an Embedded Variable Voltage DC/DC Converter," IEEE Journal of Solid-State Circuits, Nov. 1998, vol. 33, No. 11, IEEE, Los Alamitos, CA.

Horowitz, P., et al., "The Art of Electronics," Second Edition, 1989, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, vol. 89, No. 6, pp. 833-845, IEEE, Los Alamitos, CA.

* cited by examiner

LATERALLY DIFFUSED METAL OXIDE SEMICONDUCTOR DEVICE AND METHOD OF FORMING THE SAME

This application is a divisional of U.S. patent application Ser. No. 10/767,684, entitled "Laterally Diffused Metal Oxide Semiconductor Device and Method of Forming the Same," filed on Jan. 29, 2004, now U.S. Pat. No. 7,230,302, which application is incorporated herein by reference.

TECHNICAL FIELD

The present invention is directed, in general, to the semiconductor devices and, more specifically, to a laterally diffused metal oxide semiconductor device and method of forming the same.

BACKGROUND

The design of early integrated circuits focused on implementing an increasing number of small semiconductor devices on a semiconductor substrate to achieve substantial improvements in manufacturing efficiency and cost, product size, and performance. The continuing improvements in the design of integrated circuits over the past few decades has been so dramatic and so pervasive in numerous products that the effects can be measured in changes in industries.

The design and construction of integrated circuits has continued to evolve in a number of different areas. One area of innovation is a continuing reduction of feature sizes of semiconductor devices such as control and signal processing devices formed on a semiconductor substrate. Another area of innovation is the advent of construction techniques to incorporate higher voltage semiconductor devices (also referred to as "higher voltage devices") having higher voltage handling capability such as switches of a power train of a power converter into the integrated circuits.

An objective of incorporating control and signal processing devices on a semiconductor substrate with the higher voltage devices often encounters conflicting design requirements. More specifically, lower voltages (e.g., 2.5 volts) are employed with the control and signal processing devices (hence, also referred to as "low voltage devices") to prevent flashover between the fine line structures thereof. A potential difference of only a few volts separated by a fraction of a micrometer can produce electric fields of sufficient magnitude to induce locally destructive ionization in the control and signal processing devices.

When employing the higher voltage devices therewith, it is often necessary to sense and switch higher external circuit voltages (e.g., ten volts or higher) on the integrated circuit. To accommodate the higher voltage devices on a semiconductor substrate with the control and signal processing devices, a large number of processing steps are performed to produce the integrated circuit. Since the cost of an integrated circuit is roughly proportional to the number of processing steps to construct the same, there has been limited progress in the introduction of low cost integrated circuits that include both control and signal processing devices and higher voltage devices such as the switches of the power train of a power converter.

The aforementioned constraints have been exacerbated by the need to employ a substantial area of the semiconductor substrate to incorporate more efficient and even higher voltage devices into an integrated circuit. Inasmuch as the cost of a die that incorporates the integrated circuit is roughly proportional to the area thereof, the presence of the higher voltage devices conflicts with the reduction in area achieved by incorporating the fine line features in the control and signal processing devices.

With respect to the type of semiconductor devices readily available, complementary metal oxide semiconductor ("CMOS") devices are commonly used in integrated circuits. The CMOS devices such P-type metal oxide semiconductor ("PMOS") devices and N-type metal oxide semiconductor ("NMOS") devices are used as logic devices, memory devices, or other devices such as the control and signal processing devices. In addition to the CMOS devices, laterally diffused metal oxide semiconductor ("LDMOS") devices such as P-type laterally diffused metal oxide semiconductor ("P-LDMOS") devices and N-type laterally diffused metal oxide semiconductor ("N-LDMOS") devices are also commonly used in integrated circuits. LDMOS devices are generally used for the higher voltage devices in the integrated circuit. In the context of CMOS technology, the higher voltage devices generally relate to devices that operate at voltages above a standard operating voltage for the selected CMOS devices (e.g., the low voltage devices). For instance, CMOS devices employing fine line structures having 0.25 micrometer line widths operate at or below about 2.5 volts. Thus, higher voltage devices generally include any devices operating above approximately 2.5 volts.

Integrating the CMOS and LDMOS devices on a semiconductor substrate has been a continuing goal in the field of microelectronics and has been the subject of many references over the years. For instance, U.S. Pat. No. 6,541,819 entitled "Semiconductor Device Having Non-Power Enhanced and Power Enhanced Metal Oxide Semiconductor Devices and a Method of Manufacture Therefor," to Lotfi, et al., issued Apr. 1, 2003, which is incorporated herein by reference, incorporates non-power enhanced metal oxide semiconductor devices (i.e., low voltage devices) with power enhanced metal oxide semiconductor devices (i.e., higher voltage devices) on a semiconductor substrate. While Lotfi, et al. provides a viable alternative to integrating low voltage devices and higher voltage devices on the semiconductor substrate, further improvements are preferable in view of the higher voltage handling capability associated with the use of higher voltage devices such as with the LDMOS devices in the power train of a power converter.

In the field of power microelectronics, the CMOS devices may be employed as the control and signal processing devices integral to the controller of a power converter. As an example, the control and signal processing devices are employed as low voltage switches and comparators that form portions of the controller of the power converter. The LDMOS devices, on the other hand, may be employed as the higher voltage devices integral to the power train of the power converter. The higher voltage devices perform the power switching functions to control the flow of power to, for instance, a microprocessor. The power switches include the main power switches, synchronous rectifiers, and other power switches germane to the power train of the power converter. The power switches can also be used for circuit protection functions such as a rapidly acting electronic version of an ordinary fuse or circuit breaker. Variations of power switches include metal oxide semiconductor field effect transistors ("MOSFETs") that exhibit low level gate-to-source voltage limits (e.g. 2.5 volts) and otherwise are capable of handing the higher voltages germane to the power train of the power converter.

To achieve the overall reduction in size, the integrated circuits as described herein should include control and signal processing devices with fine line structures having sub micron line widths (e.g., 0.25 micrometers) on a semiconductor substrate that operate with lower voltages to prevent flashover within the integrated circuit. At the same time, the integrated circuit may incorporate higher voltage devices that can conduct amperes of current and withstand voltages of, for instance, ten volts. A benefit of incorporating the low voltage devices and the higher voltage devices on the semiconductor substrate is that it is possible to accommodate higher switching frequencies in the design of the power processing circuit due to a reduction of parasitic capacitances and inductances in the integrated circuit.

Accordingly, what is needed in the art is a semiconductor device and method of forming the same that incorporates low voltage devices and higher voltage devices on a semiconductor substrate that overcomes the deficiencies in the prior art. Additionally, there is a need in the art for a higher voltage device (e.g., a transistor such as a LDMOS device) that can accommodate higher voltages and is capable of being integrated with low voltage devices on a semiconductor substrate in an integrated circuit that may form a power converter or portions thereof.

SUMMARY OF THE INVENTION

These and other problems are generally solved or circumvented, and technical advantages are generally achieved, by advantageous embodiments of the present invention which includes a transistor advantageously embodied in a laterally diffused metal oxide semiconductor ("LDMOS") device having a gate located over a channel region recessed into a semiconductor substrate and a method of forming the same. In one embodiment, the LDMOS device includes a source/drain having a lightly doped region located adjacent the channel region and a heavily doped region located adjacent the lightly doped region. The LDMOS device further includes an oppositely doped well located under and within the channel region, and a doped region, located between the heavily doped region and the oppositely doped well, having a doping concentration profile less than a doping concentration profile of the heavily doped region. In one advantageous embodiment, the source/drain includes P-type lightly and heavily doped regions and the oppositely doped well is an N-type well. In accordance therewith, the doped region is a P-type doped region having a doping concentration profile less than a doping concentration profile of the P-type heavily doped region.

In another aspect, the present invention provides a semiconductor device on a semiconductor substrate and a method of forming the same. In one embodiment, the semiconductor device includes a complementary metal oxide semiconductor ("CMOS") device and a LDMOS device formed on the semiconductor substrate. The LDMOS device includes a gate located over a channel region recessed into the semiconductor substrate, and a source/drain including a lightly doped region located adjacent the channel region and a heavily doped region located adjacent the lightly doped region. The LDMOS device also includes an oppositely doped well located under and within the channel region, and a doped region, located between the heavily doped region and the oppositely doped well, having a doping concentration profile less than a doping concentration profile of the heavily doped region. In a related, but alternative embodiment, the CMOS device includes a source/drain having a heavily doped region with a doping concentration profile different from the doping concentration profile of the heavily doped region of the source/drain of the LDMOS device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a transistor [e.g., embodied in a laterally diffused metal oxide semiconductor ("LDMOS") device], a semiconductor device incorporating the LDMOS device and methods of forming the same. While the principles of the present invention will be described in the environment of a power converter, any application that may benefit from a transistor that can accommodate higher voltages and is integrable with a low voltage device [e.g., complementary metal oxide semiconductor ("CMOS") device] on a semiconductor substrate is well within the broad scope of the present invention.

The advantages associated with incorporating the higher voltage LDMOS devices with the low voltage CMOS devices facilitate the ongoing incorporation of integrated circuits with higher levels of integration into more products such as power converters. For the purposes of the present invention higher voltage devices refer to devices that can accommodate higher operating voltages than the standard operating voltages for a referenced low voltage device. As an example and in the context of CMOS technology, the higher voltage devices generally relate to devices that operate at voltages above a standard operating voltage for the selected CMOS devices (e.g., the low voltage devices). For instance, CMOS devices employing fine line structures having 0.25 micrometer line widths operate at or below about 2.5 volts. Thus, higher voltage devices generally include any devices operating above approximately 2.5 volts. In yet another context, the higher voltage devices also generally include devices that may exhibit a low level gate-to-source voltage limit (e.g., 2.5 volts) and, at the same time, can handle drain-to-source voltages above the gate-to-source voltage limit thereof (e.g., ten volts).

Figure 1:
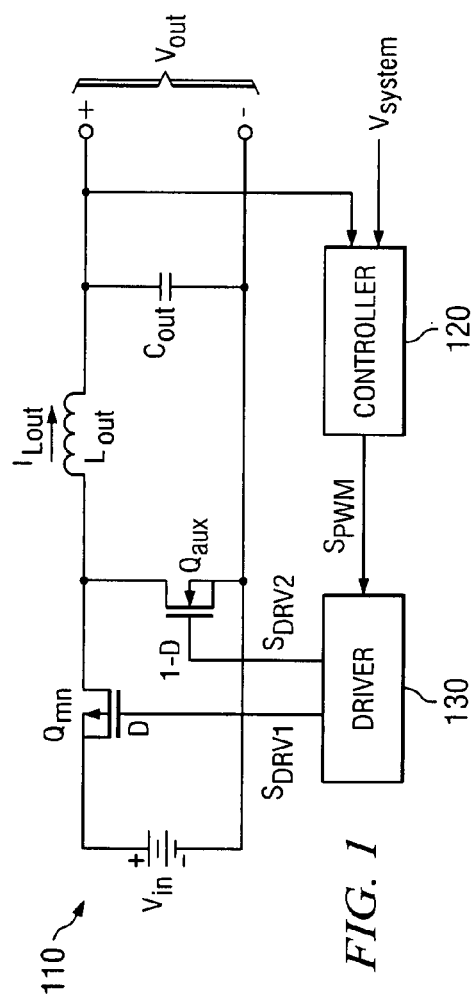
FIG. 1 illustrates a block diagram of an embodiment of a power converter including a semiconductor device constructed according to the principles of the present invention.

Referring initially to FIG. 1, illustrated is a block diagram of an embodiment of a power converter including a semiconductor device constructed according to the principles of the present invention. The power converter includes a power train 110, a controller 120 and a driver 130, and provides power to a system such as a microprocessor. While in the illustrated embodiment, the power train 110 employs a buck converter topology, those skilled in the art should understand that other converter topologies such as a forward converter topology are well within the broad scope of the present invention.

The power train 110 of the power converter receives an input voltage $V_{in}$ from a source of electrical power (represented by a battery) at an input thereof and provides a regulated output voltage $V_{out}$ to power, for instance, a microprocessor at an output of the power converter. In keeping with the principles of a buck converter topology, the output voltage $V_{out}$ is generally less than the input voltage $V_{in}$ such that a switching operation of the power converter can regulate the output voltage $V_{out}$. A main switch $Q_{mn}$ [e.g., a P-channel metal oxide semiconductor field effect transistor ("MOSFET") embodied in a P-type laterally diffused metal oxide semiconductor ("P-LDMOS") device] is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train 110. An AC component of the inductor current $I_{Lout}$ is filtered by the output capacitor $C_{out}$.

During a complementary interval (generally co-existent with a complementary duty cycle "1-D" of the main switch $Q_{mn}$), the main switch $Q_{mn}$ is transitioned to a non-conducting state and an auxiliary switch $Q_{aux}$ [e.g., an N-channel MOSFET embodied in an N-type laterally diffused metal oxide semiconductor ("N-LDMOS") device] is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary switches $Q_{mn}$, $Q_{aux}$ may be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

The controller 120 of the power converter receives a desired characteristic such as a desired system voltage $V_{system}$ from an internal or external source associated with the microprocessor, and the output voltage $V_{out}$ of the power converter. In accordance with the aforementioned characteristics, the controller 120 provides a signal (e.g., a pulse width modulated signal $S_{PWM}$) to control a duty cycle and a frequency of the main and auxiliary switches $Q_{mn}$, $Q_{aux}$ of the power train 110 to regulate the output voltage $V_{out}$ thereof. Any controller adapted to control at least one switch of the power converter is well within the broad scope of the present invention. As an example, a controller employing digital circuitry is disclosed in U.S. Patent Publication No. 2005/0169024 (now U.S. Pat. No. 7,038,438), entitled "Controller for a Power Converter and a Method of Controlling a Switch Thereof," to Dwarakanath, et al. and U.S. Patent Publication No. 2005/0168205 (now U.S. Pat. No. 7,019,505), entitled "Controller for a Power Converter and Method of Controlling a Switch Thereof," to Dwarakanath, et al., which are incorporated herein by reference.

The power converter also includes the driver 130 configured to provide drive signals $S_{DRV1}$, $S_{DRV2}$ to the main and auxiliary switches $Q_{mn}$, $Q_{aux}$, respectively, based on the signal $S_{PWM}$ provided by the controller 120. There are a number of viable alternatives to implement a driver 130 that include techniques to provide sufficient signal delays to prevent crosscurrents when controlling multiple switches in the power converter. The driver 130 typically includes switching circuitry incorporating a plurality of driver switches that cooperate to provide the drive signals $S_{DRV1}$, $S_{DRV2}$ to the main and auxiliary switches $Q_{mn}$, $Q_{aux}$. Of course, any driver 130 capable of providing the drive signals $S_{DRV1}$, $S_{DRV2}$ to control a switch is well within the broad scope of the present invention. Additionally, an embodiment of a driver is disclosed in U.S. Patent Publication No. 2005/0168203 (now U.S. Pat. No. 7,330,017), entitled "Driver for a Power Converter and Method of Driving a Switch Thereof," to Dwarakanath, et al., which is incorporated herein by reference.

According to the principles of the present invention, the main and auxiliary switches $Q_{mn}$, $Q_{aux}$ are power switches that can be incorporated into a semiconductor device proximate control or signal processing devices that perform the control functions of the controller 120 of the power converter. As mentioned above, the control and signal processing devices are typically CMOS devices such as P-type metal oxide semiconductor ("PMOS") devices and N-type metal oxide semiconductor ("NMOS") devices (also generally referred to as a "CMOS device and another CMOS device," and vice-versa). The PMOS and NMOS devices may also be referred to as P-channel and N-channel MOSFETs, respectively. Lower voltages (e.g., 2.5 volts) are employed with the control and signal processing devices (hence, also referred to as "low voltage devices") to prevent flashover between the fine line structures thereof. The main and auxiliary switches $Q_{mn}$, $Q_{aux}$ of the power train 110 and ones of the plurality of driver switches of the driver 130 are typically formed by LDMOS devices that handle higher voltages (e.g., ten volts) and hence are referred to as higher voltage devices. Integrating the control and signal processing devices, power switches and driver switches on a semiconductor substrate provides opportunities for substantial reductions in cost and size of the power converter or other apparatus employing like devices.

Figure 2:
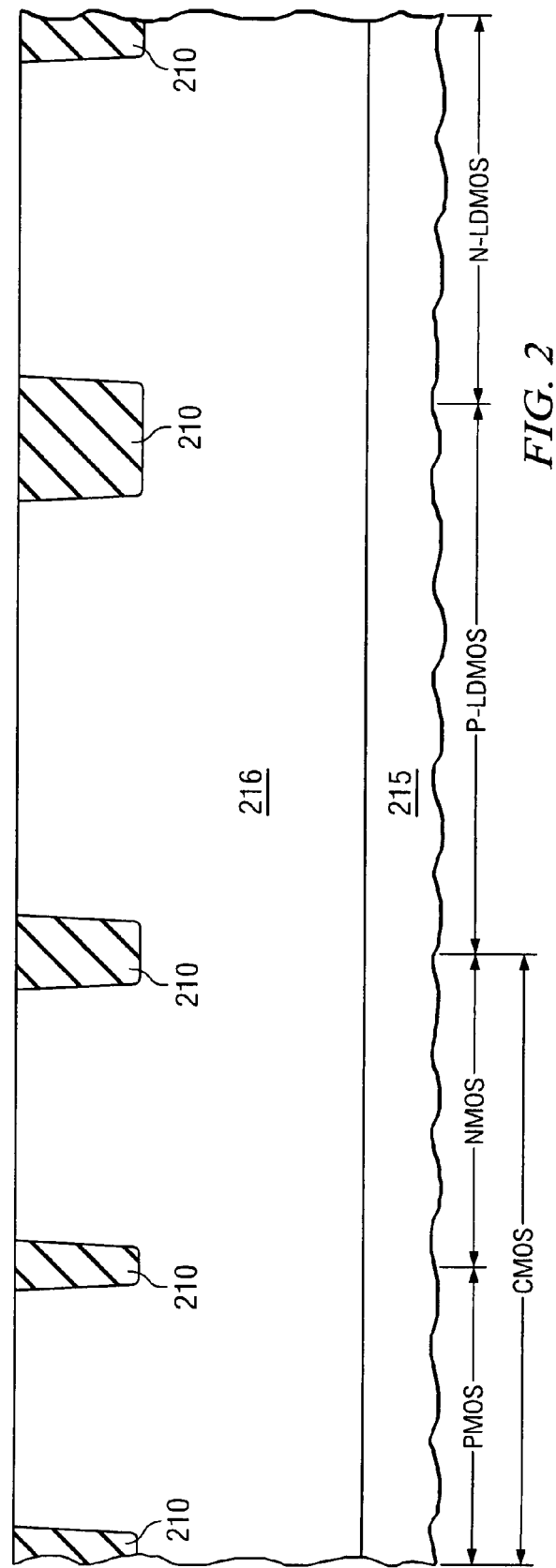
FIGS. 2 through 14 illustrate cross sectional views of an embodiment of constructing a semiconductor device according to the principles of the present invention.

Turning now to FIGS. 2 through 14, illustrated are cross sectional views of an embodiment of constructing a semiconductor device according to the principles of the present invention. Beginning with FIG. 2, illustrated is a cross sectional view of an embodiment of a partially completed semiconductor device including shallow trench isolation regions 210 constructed in accordance with one or more aspects of the present invention. In accordance with standard practices in the semiconductor industry, various features in this and subsequent drawings are not drawn to scale. The dimensions of the various features may be arbitrarily increased or decreased for clarity of the discussion herein and like reference numbers may be employed for analogous features of different devices that make up the semiconductor device.

The semiconductor device includes a semiconductor substrate (also referred to as a "substrate") 215 and grown on a surface thereof is an epitaxial layer (e.g., a P-type epitaxial layer) 216, preferably doped between $1\times10^{14}$ and $1\times10^{16}$ atoms/cm$^3$. The epitaxial layer 216 may not be needed, particularly if the substrate 215 is a lightly doped P-type. Although in the illustrated embodiment, the substrate 215 is a P-type substrate, one skilled in the art understands that the substrate 215 could be an N-type substrate, without departing from the scope of the present invention.

The substrate 215 is divided into four dielectrically separated areas to accommodate, in the illustrated embodiment, four transistors (e.g., MOSFETs) located thereon. More specifically, the substrate 215 can accommodate a PMOS device and an NMOS device that operate as low voltage devices within, for instance, a controller of a power converter (i.e., the control and signal processing devices). Additionally, the substrate 215 can accommodate a P-LDMOS device and an N-LDMOS device (also generally referred to as a "LDMOS device and another LDMOS device," and vice-versa) that operate as higher voltage devices within, for instance, a power train and driver of a power converter (i.e., the power switches and driver switches).

The shallow trench isolation regions 210 are formed within the epitaxial layer 216 of the substrate 215 to provide dielectric separation between the devices implemented on the substrate 215. The shallow trench isolation regions 210 are formed by masking the substrate 215 and using a photoresist to define the respective regions therein. The shallow trench isolation regions 210 are then etched and backfilled with a dielectric such as silicon dioxide, silicon nitride, a combination thereof, or any other suitable dielectric material. Then, the epitaxial layer of the substrate 215 and the shallow trench isolation regions 210 are planarized by a lapping process. The steps of masking, etching, backfilling with the dielectric and lapping are well known in the art and will not hereinafter be described in further detail.

Figure 3:
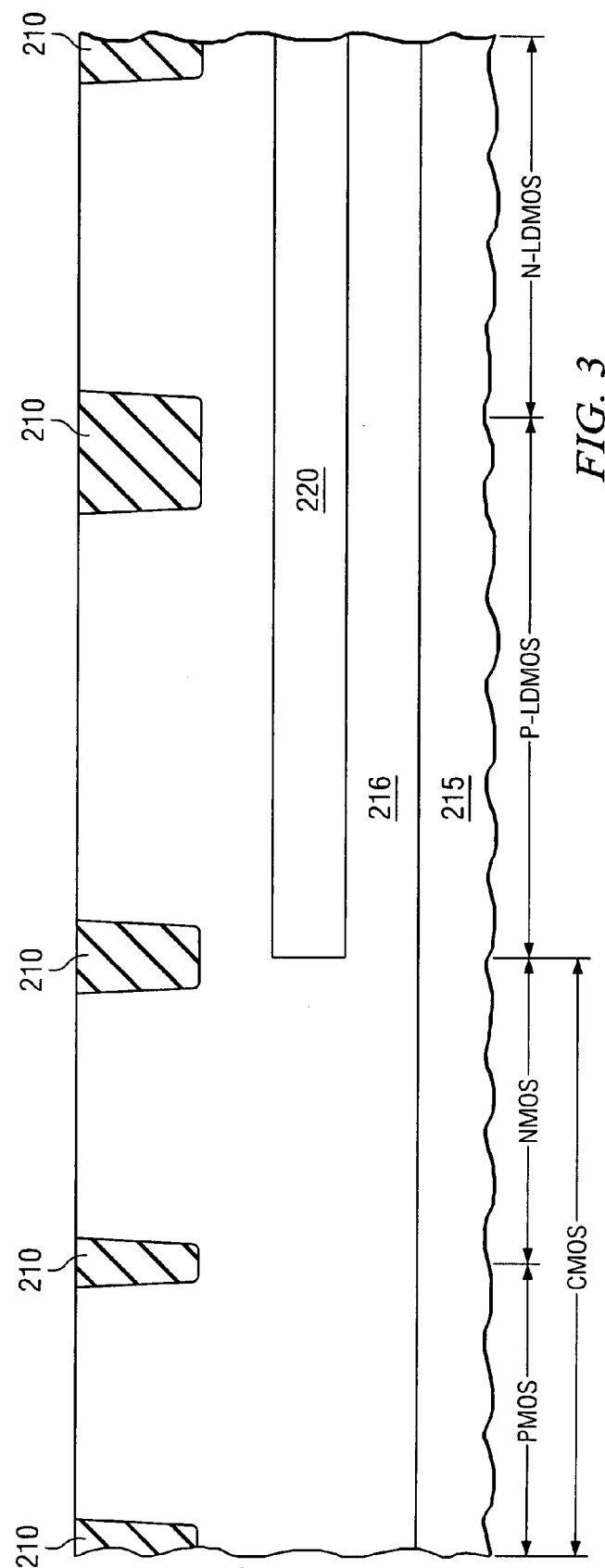

Turning now to FIG. 3, illustrated is a cross sectional view of an embodiment of a partially completed semiconductor device including a buried layer (e.g., an N-type buried layer) 220 constructed in accordance with one or more aspects of the present invention. As illustrated, the N-type buried layer 220 is recessed within the epitaxial layer 216 of the substrate 215 in the area that accommodates the P-LDMOS device and the N-LDMOS device. The N-type buried layer 220 is formed by a deep ion implantation process (e.g., at a controlled voltage of about 200 kiloelectronvolts) of an appropriate dopant specie such as arsenic or phosphorus and results in a doping concentration profile, preferably in a range of $1\times10^{18}$ to $1\times10^{20}$ atoms/cm$^3$. The N-type buried layer 220 is preferably located approximately one micrometer below a top surface of the epitaxial layer 216 of the substrate 215, and is annealed (e.g., at 600 to 1200 degrees Celsius) as necessary to provide the proper distribution of the implanted ion specie. A lateral location of the N-type buried layer 220 is controlled by a photoresist mask using techniques well known in the art. The steps of masking, ion implanting and annealing are well known in the art and will not hereinafter be described in further detail.

Figure 4:
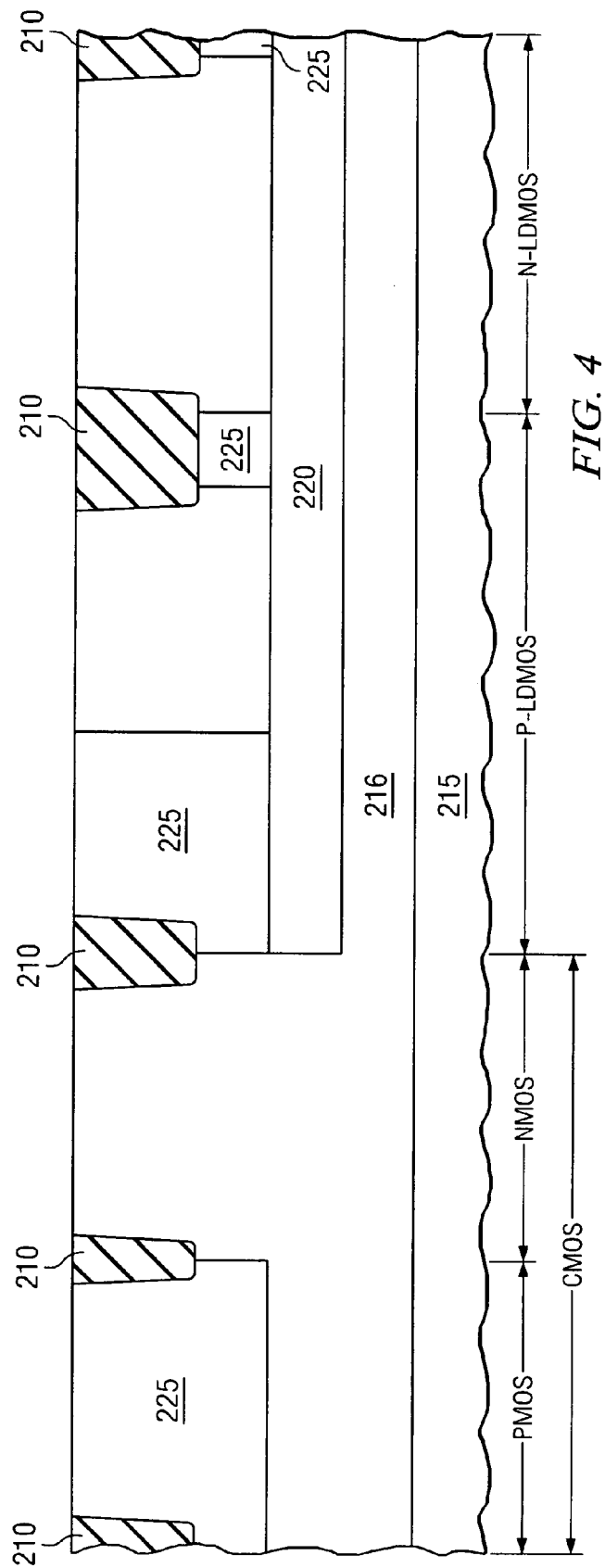

Turning now to FIG. 4, illustrated is a cross sectional view of an embodiment of a partially completed semiconductor device including wells (e.g. N-type wells) 225 constructed in accordance with one or more aspects of the present invention. The N-type wells 225 are constructed with similar doping concentration profiles employing an ion implantation process. The N-type wells 225 are formed in the epitaxial layer 216 of the substrate 215 in the areas that accommodate the PMOS device and the P-LDMOS device, and under the shallow trench isolation regions 210 above the N-type buried layer 220 (for the P-LDMOS). The N-type wells 225 are formed to provide electrical isolation for the PMOS device and the P-LDMOS device and operate cooperatively with the N-type buried layer 220 (in the case of the P-LDMOS device) and the shallow trench isolation regions 210 to provide the isolation.

A photoresist mask defines the lateral areas for ion implantation process. After the ion implantation process, the implanted specie is diffused by annealing the substrate 215 at elevated temperature. An appropriate dopant specie such as arsenic or phosphorus can be used to form the N-type wells 225, preferably, but without limitation, in a retrograde doping concentration profile with approximately $1\times10^{17}$ atoms/cm3 in the middle, and a higher doping concentration profile at the surface as well as at the bottom. The steps of masking, ion implanting and annealing are well known in the art and will not hereinafter be described in further detail.

A width of the N-type wells 225 may vary depending on the particular devices and application and, as one skilled in the art knows, may be laterally defined by the photoresist mask. For instance, the N-type well 225 above the N-type buried layer 220 does not cover the entire area that accommodates the P-LDMOS device in the epitaxial layer 216 of the substrate 215 between the shallow trench isolation regions 210 thereof. The advantages of forming the N-type well 225 in the epitaxial layer 216 of the substrate 215 within a portion of the area that accommodates the P-LDMOS device will become more apparent for the reasons as set forth below.

Figure 5:
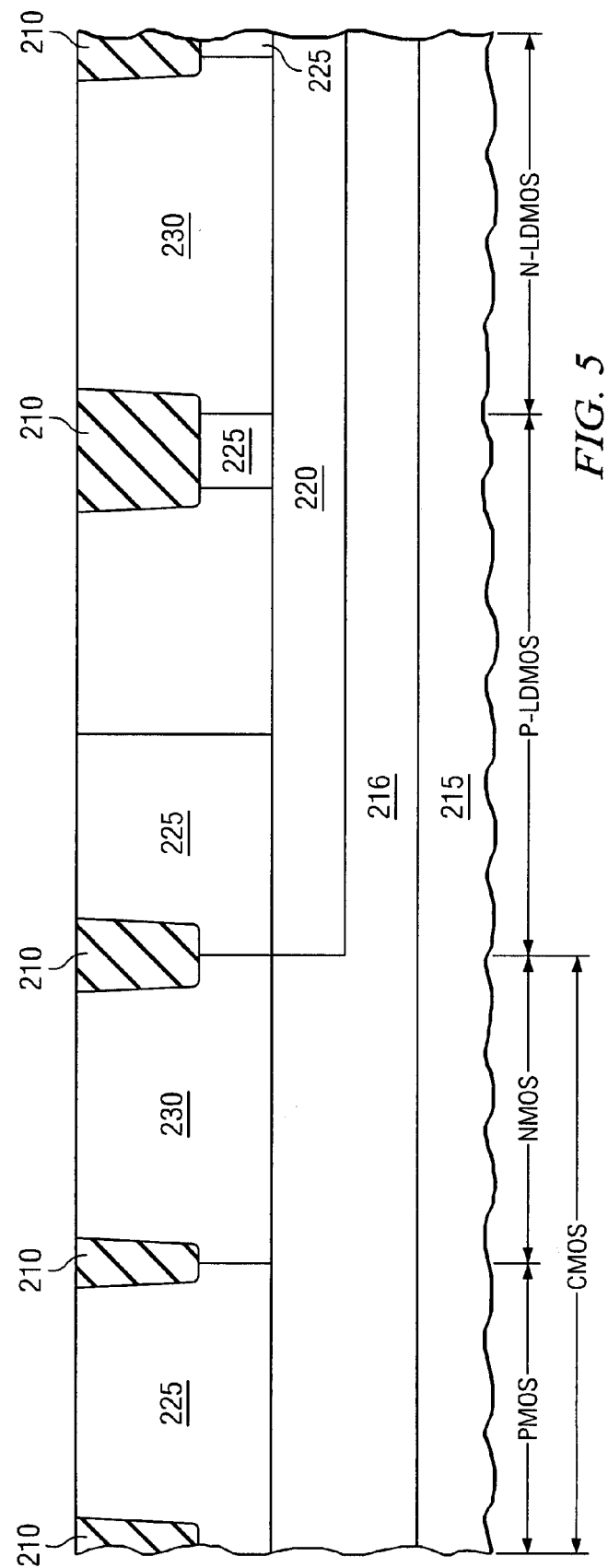

Turning now to FIG. 5, illustrated is a cross sectional view of an embodiment of a partially completed semiconductor device including wells (e.g., P-type wells) 230 constructed in accordance with one or more aspects of the present invention. The P-type wells 230 are formed with similar doping concentration profiles by ion implantation process of an appropriate specie such as boron. The P-type wells 230 are formed in the epitaxial layer 216 of the substrate 215 between the shallow trench isolation regions 210 substantially in the areas that accommodate the NMOS device and N-LDMOS device. A photoresist mask defines the lateral areas for the ion implantation process. After the ion implantation process, the implanted specie is diffused by an annealing the substrate 215 at an elevated temperature.

Again, an appropriate dopant specie such as boron can be used to form the P-type wells 230, preferably resulting in a retrograde doping concentration profile with approximately $1\times10^{17}$ atoms/cm3 in the middle, and a higher doping concentration profile at the top surface as well as at the bottom. The steps of masking, ion implanting and annealing are well known in the art and will not hereinafter be described in further detail. Analogous to the N-type wells 225, a width of the P-type wells 230 may vary depending on the particular devices and application and, as one skilled in the art knows, may be laterally defined by the photoresist mask. For instance, while the P-type well 230 above the N-type buried layer 220 covers the entire area that accommodates the N-LDMOS device in the epitaxial layer 216 of the substrate 215 between the shallow trench isolation regions 210 thereof, it is well within the broad scope of the present invention to define the P-type well 230 to cover a portion of the area that accommodates the N-LDMOS device in the epitaxial layer 216 of the substrate 215.

Figure 6:
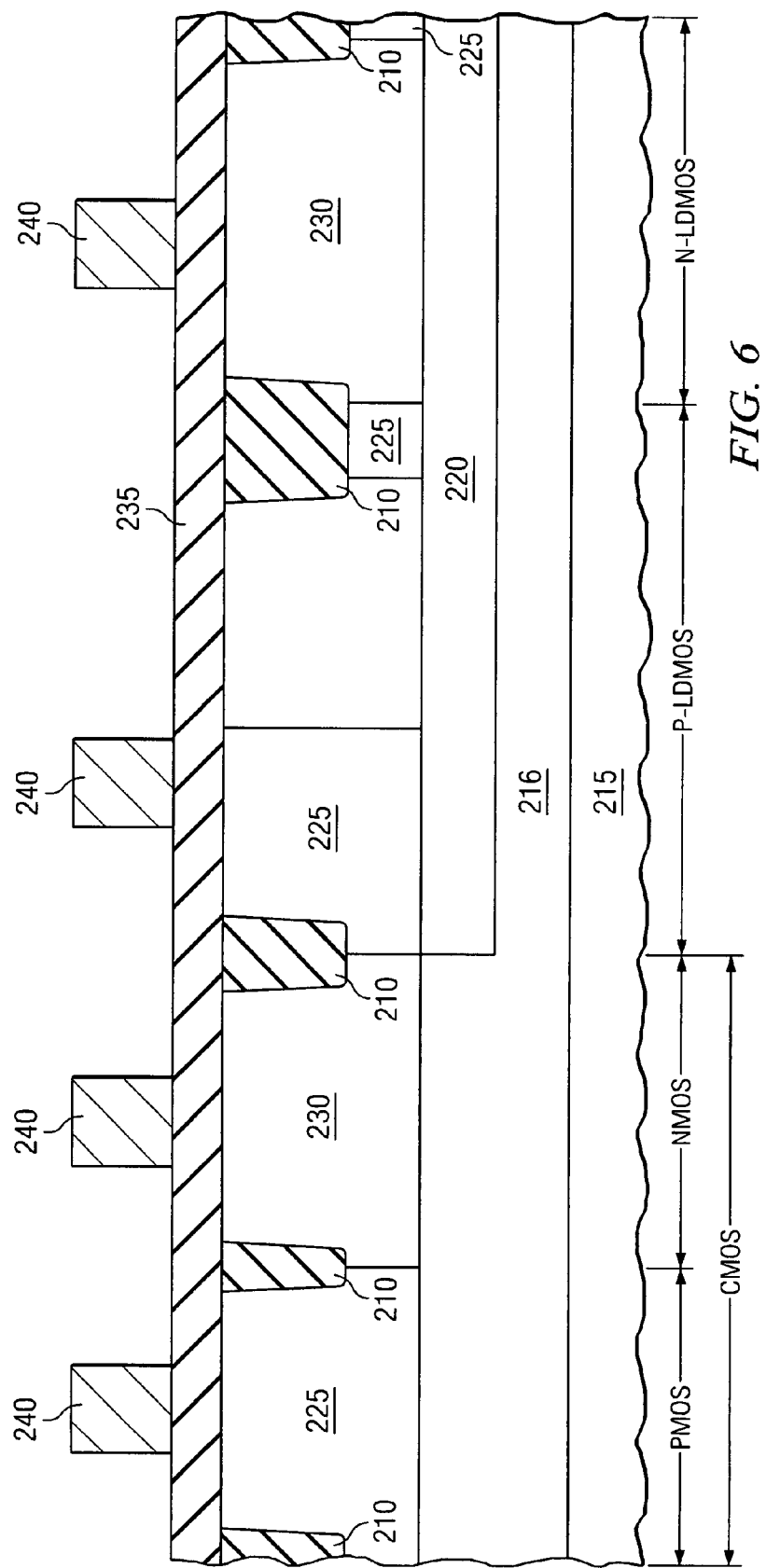

Turning now to FIG. 6, illustrated is a cross sectional view of an embodiment of a partially completed semiconductor device including gates 240 for the PMOS, NMOS, P-LDMOS and N-LDMOS devices constructed in accordance with one or more aspects of the present invention. The process of forming the gates 240 is preceded by forming gate dielectric layer 235 over the epitaxial layer 216 of the substrate 215 of a thickness consistent with the intended operating voltage of the gates 240. The dielectric material is typically silicon dioxide with a thickness of about five nanometers for devices employing about 0.25 micrometer feature sizes and operating at low gate voltages (e.g., 2.5 volts). Assuming the gate-to-source voltage limit of the P-LDMOS and N-LDMOS devices is limited to a lower voltage (e.g., 2.5 volts) and the PMOS and NMOS devices operate at the same voltage, then the gate dielectric layer 235 can be formed with dimensions as set forth above. Preferably, the gate dielectric layer 235 is constructed with a uniform thickness to provide a gate-to-source voltage rating for the devices of approximately 2.5 volts that completely or nearly completely saturates the forward conduction properties of the device. Of course, the aforementioned voltage range for the devices is provided for illustrative purposes only and other voltage ranges are within the broad scope of the present invention.

Next, a polysilicon layer is deposited over a surface of the gate dielectric layer 235 and doped N-type or P-type, using an appropriate doping specie. The polysilicon layer is annealed at an elevated temperature to properly diffuse the dopant. A photoresist mask is employed with an etch to define the lateral dimensions to define the gates 240. The steps of depositing the dielectric and polysilicon layers, doping, annealing, and patterning are well known in the art and will not hereinafter be described in further detail. Alternatively, the gates 240 may include a wide range of materials including various metals, doped semiconductors, or other conductive materials. Additionally, the gates 240 may have a wide range of thicknesses. The thickness of the gates 240 may range from about 100 to about 500 nanometers, but may be even smaller or larger depending on the application.

The underlying gate dielectric layer 235 and the gates 240 are formed using conventional processes and will not hereinafter be described in further detail. The conventional processes include, but are not limited to, thermal oxidation, chemical vapor deposition, physical vapor deposition, epitaxial growth, or other similar process. It is recognized that the gate dielectric layer 235 and gates 240 may have different thicknesses in different areas of the substrate 215 without departing from the scope of the present invention.

Figure 7:
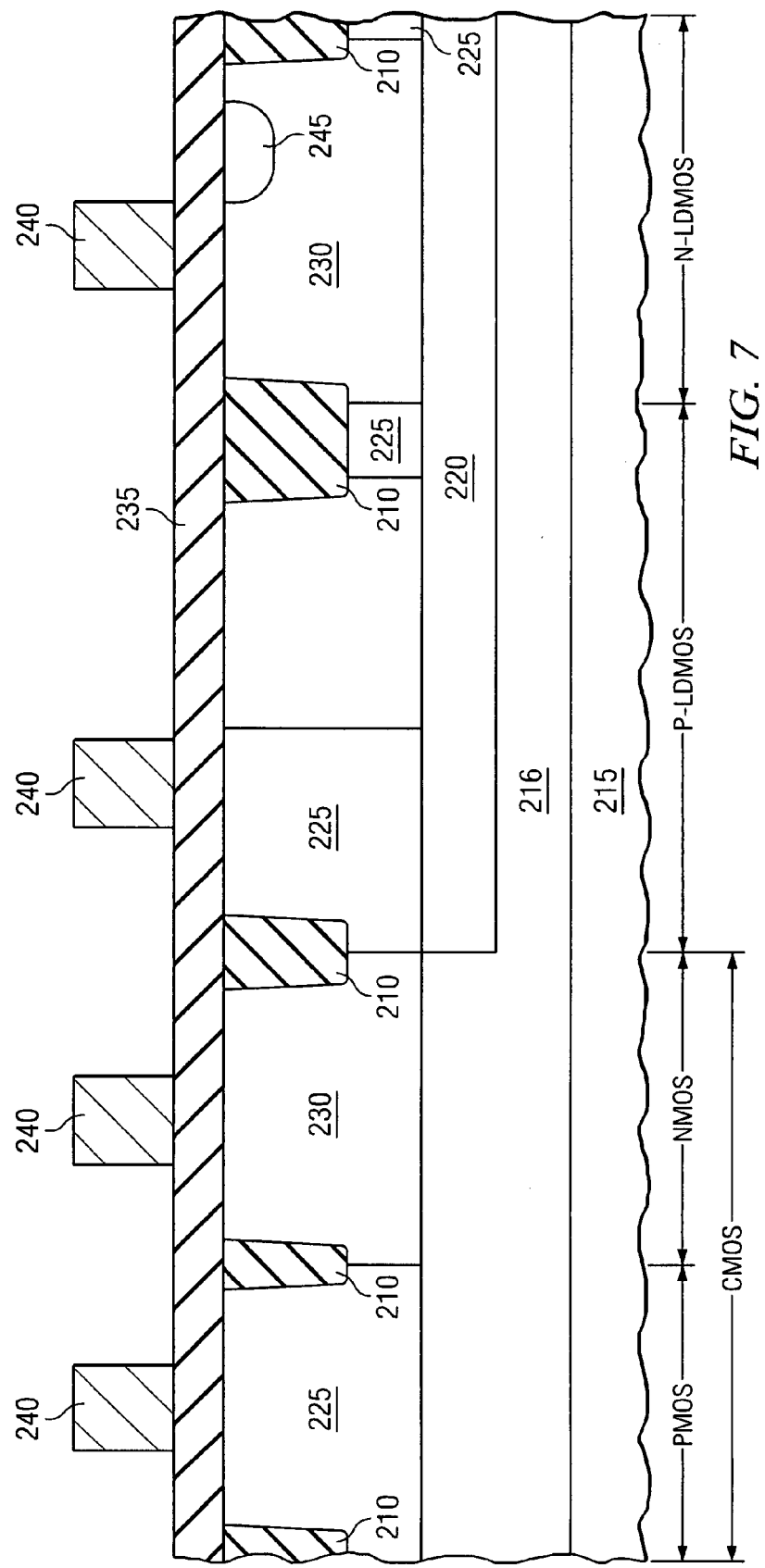

Turning now to FIG. 7, illustrated is a cross sectional view of an embodiment of a partially completed semiconductor device including a lightly doped region (e.g., an N-type lightly doped region) 245 of a drain (also referred to as a "N-type lightly doped drain region") for the N-LDMOS device constructed in accordance with one or more aspects of the present invention. The N-type lightly doped drain region 245 allows the N-LDMOS device to accommodate higher voltage operation from the drain to the source thereof. The N-type lightly doped drain region 245 may be formed employing an ion implantation process in connection with a photoresist mask to define the lateral dimensions thereof. Additionally, an annealing process at elevated temperatures distributes the implanted ion specie. The N-type lightly doped drain region 245 is preferably doped, without limitation, to about $1 \times 10^{16}$ to about $1 \times 10^{17}$ atoms/cm$^3$. The steps of patterning, ion implanting and annealing are well known in the art and will not hereinafter be described in further detail.

Figure 8:
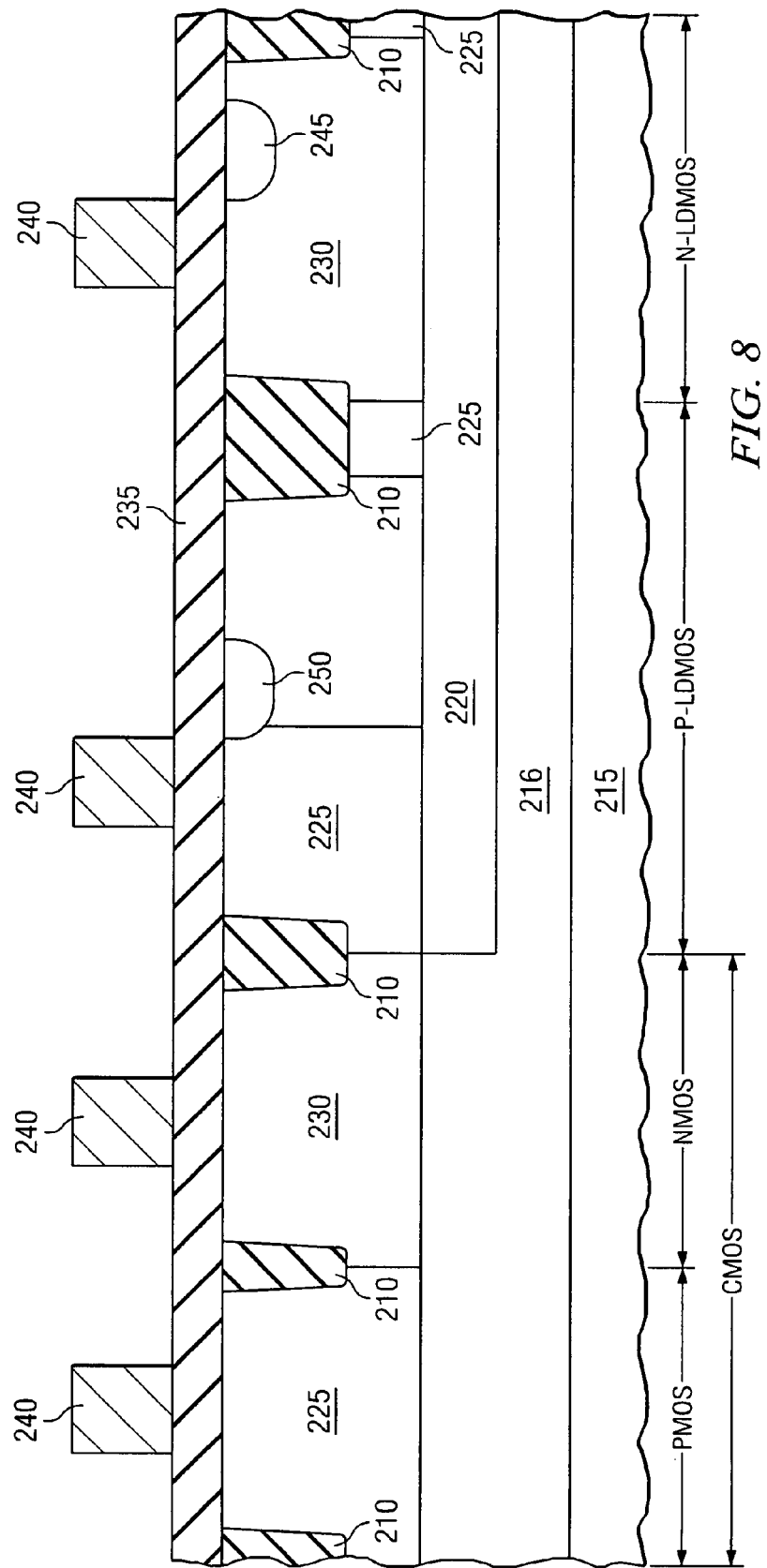

Turning now to FIG. 8, illustrated is a cross sectional view of an embodiment of a partially completed semiconductor device including a lightly doped region (e.g., a P-type lightly doped region) 250 of a drain (also referred to as a "P-type lightly doped drain region") for the P-LDMOS device constructed in accordance with one or more aspects of the present invention. The P-type lightly doped drain region 250 allows the P-LDMOS device to accommodate higher voltage operation from the drain to the source thereof. The P-type lightly doped drain region 250 may be formed employing an ion implantation process in connection with a photoresist mask to define the lateral dimensions thereof. Additionally, an annealing process at elevated temperatures distributes the implanted ion specie. The P-type lightly doped drain region 250 is preferably doped, without limitation, to about $1 \times 10^{16}$ to $1 \times 10^{17}$ atoms/cm$^3$. The steps of patterning, ion implanting and annealing are well known in the art and will not hereinafter be described in further detail.

The N-type and P-type lightly doped drain regions 245, 250 provide higher voltage drains for the N-LDMOS and P-LDMOS devices, respectively. In effect, the N-type and P-type lightly doped drain regions 245, 250 form parasitic diodes with adjoining oppositely doped regions, namely, the P-type well 230 and N-type well 225, respectively. The breakdown voltage of the parasitic diodes is determined by the doping concentration profiles, with lighter doping concentration profiles providing a higher breakdown voltage because the resulting internal electric fields are distributed over longer distances when the diodes are back biased. It is recognized that the width of the N-type and P-type lightly doped drain regions 245, 250 may be individually varied to alter the breakdown voltage characteristics of the respective N-LDMOS and P-LDMOS devices without departing from the scope of the present invention.

Figure 9:
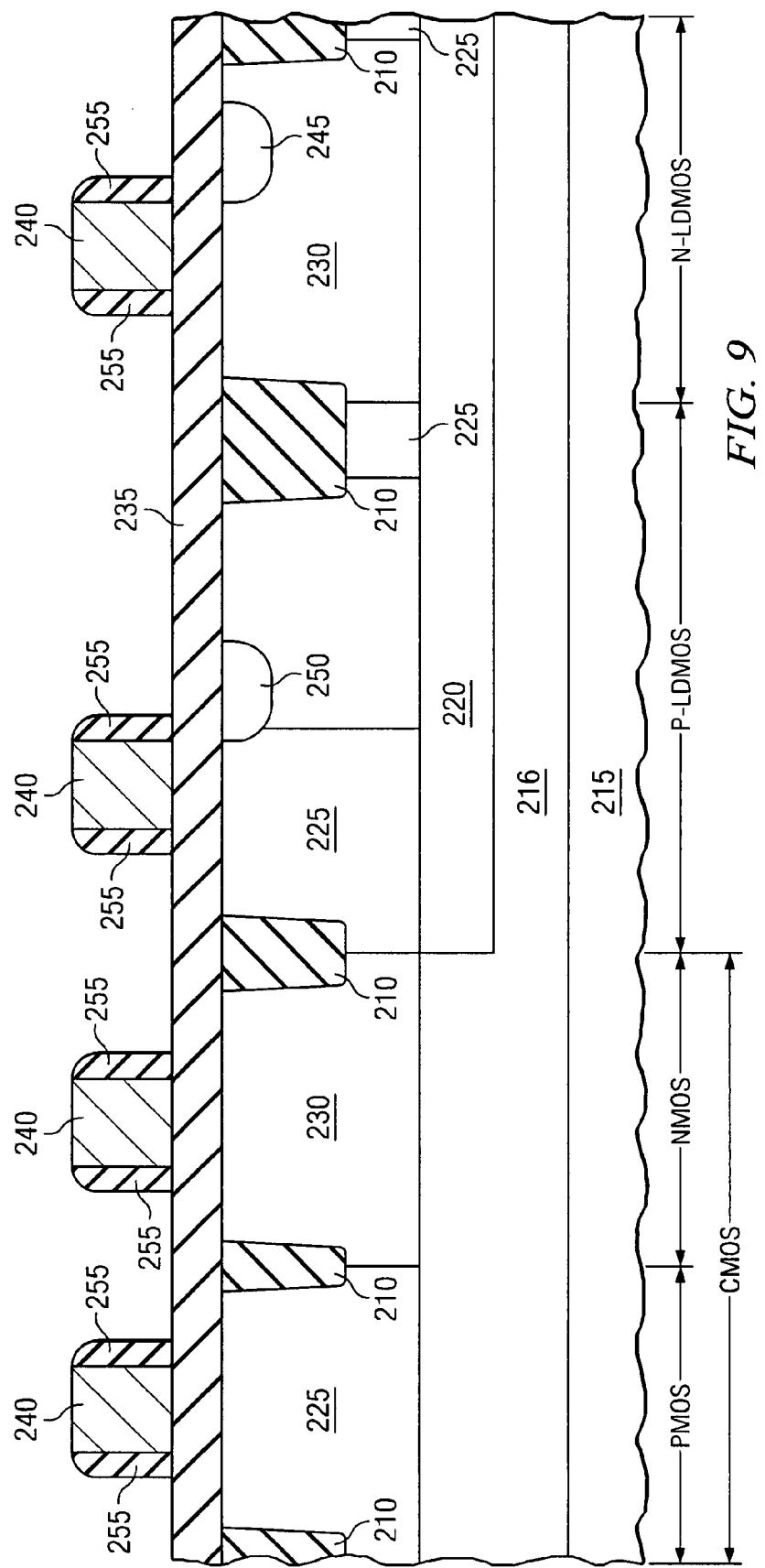

Turning now to FIG. 9, illustrated is a cross sectional view of an embodiment of a partially completed semiconductor device including gate sidewall spacers 255 about the gates 240 constructed in accordance with one or more aspects of the present invention. The gate sidewall spacers 255, which may be formed from an oxide or other dielectric material, are generally formed by depositing a nitride followed by an etching process. The material forming the gate sidewall spacers 255 may be the same or different from the dielectric material used for the gate dielectric layer 235.

Figure 10:
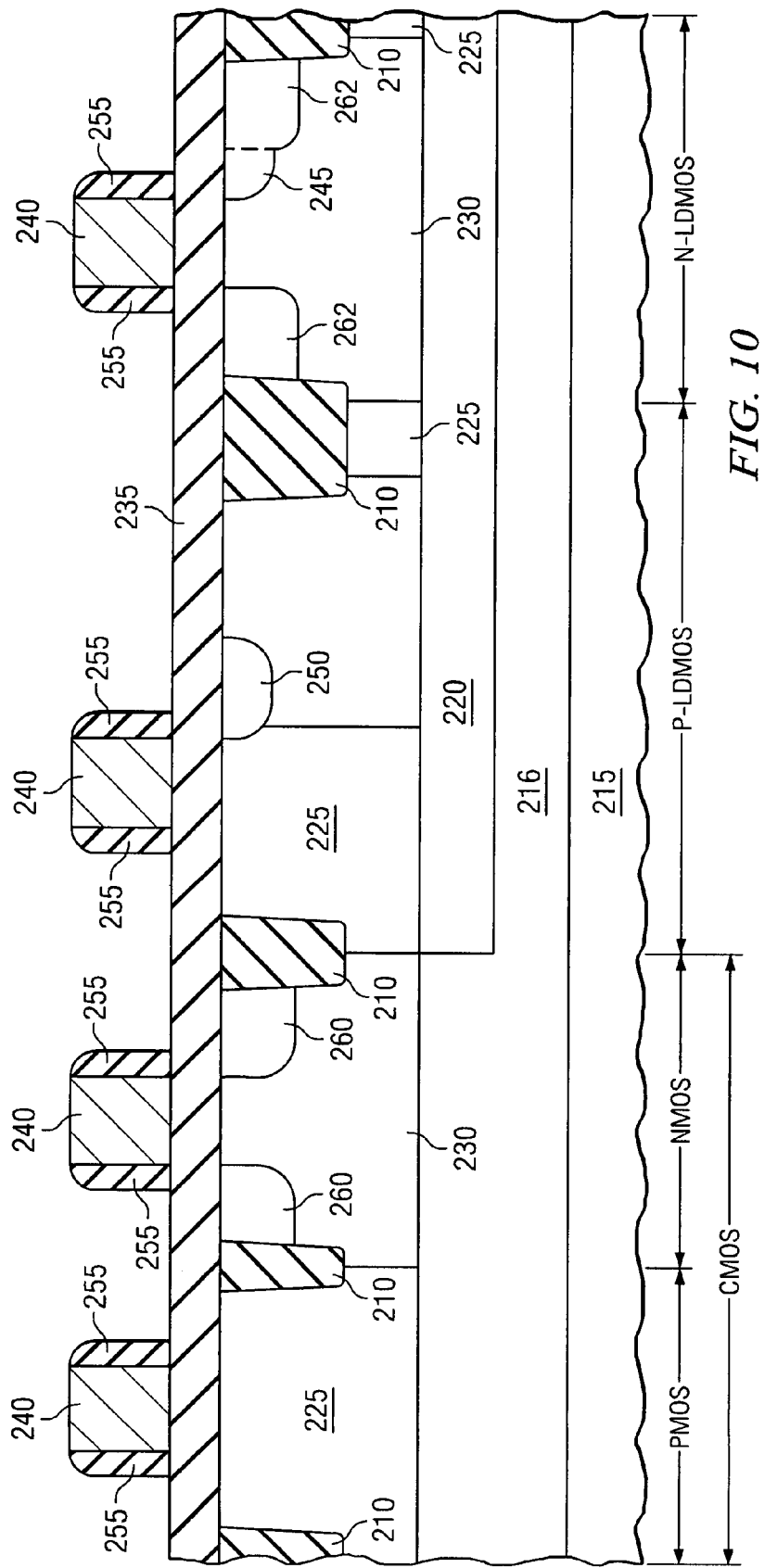

Turning now to FIG. 10, illustrated is a cross sectional view of an embodiment of a partially completed semiconductor device including heavily doped regions for the source and drain (often referred to individually as a "source/drain" and together as a "source/drain and another source/drain," and vice-versa) of the NMOS and N-LDMOS devices constructed in accordance with one or more aspects of the present invention. The heavily doped regions (e.g., N-type heavily doped regions) 260 for the source and drain of the NMOS device preferably have a different doping concentration profile than the heavily doped regions (e.g., N-type heavily doped regions) 262 for the source and drain of the N-LDMOS device. The N-type heavily doped regions 260 for the NMOS device are formed within the P-type well 230 thereof and, as alluded to above, form the source and the drain for the NMOS device. Additionally, the N-type heavily doped regions 262 for the N-LDMOS device are formed within the P-type well 230 thereof and, as alluded to above, form the source and a portion of the drain for the N-LDMOS device. Also, the N-type heavily doped region 262 of the drain for the N-LDMOS device is adjacent the N-type lightly doped drain region 245 thereof.

The N-type heavily doped regions 260, 262 may be advantageously formed with an ion implantation process using dopant specie such as arsenic or phosphorus. The doping process includes a photoresist mask to define lateral dimensions of the N-type heavily doped regions 260, 262 and an annealing process at elevated temperature to properly distribute the implanted species. The N-type heavily doped region 260 for the source and drain of the NMOS device is doped, without limitation, to be greater than about $1\times10^{19}$ atoms/cm$^3$. The N-type heavily doped region 262 for the source and drain of the N-LDMOS device is doped, without limitation, to be greater than about $5\times10^{19}$ atoms/cm$^3$. Incorporating the different doping concentration profiles of the N-type heavily doped regions 260, 262 for the source and drain of the NMOS and N-LDMOS devices typically adds additional processing steps to the design thereof. It should be understood, however, that the N-type heavily doped regions 260, 262 for the source and drain of the NMOS and N-LDMOS devices may incorporate the same or analogous doping concentration profiles and still be within the broad scope of the present invention. Inasmuch as the steps of patterning, ion implanting and annealing are well known in the art, the processes will not hereafter be described in further detail.

Figure 11:
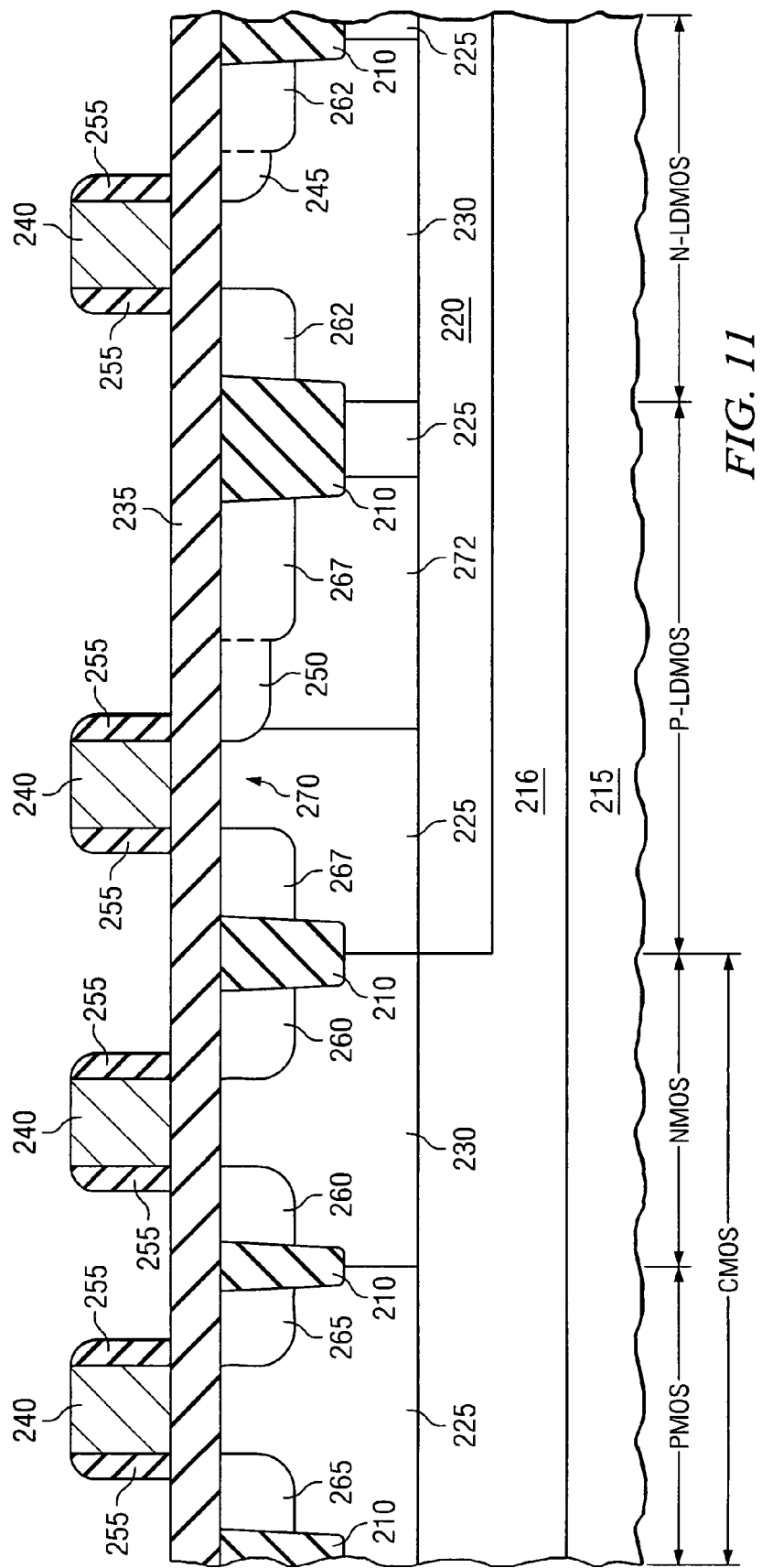

Turning now to FIG. 11, illustrated is a cross sectional view of an embodiment of a partially completed semiconductor device including heavily doped regions for the source and drain for the PMOS and P-LDMOS devices constructed in accordance with one or more aspects of the present invention. The heavily doped regions (e.g., P-type heavily doped regions) 265 for the source and drain of the PMOS device preferably have a different doping concentration profile than the heavily doped regions (e.g., P-type heavily doped regions) 267 for the source and drain of the P-LDMOS device. The P-type heavily doped regions 265 for the PMOS device are formed within the N-type well 225 thereof and, as alluded to above, form the source and the drain for the PMOS device. Additionally, the P-type heavily doped regions 267 for the P-LDMOS device are formed within the N-type well 225 or in a region adjacent the N-type well 225 thereof and, as alluded to above, form the source and a portion of the drain for the P-LDMOS device. Also, the P-type heavily doped region 267 of the drain for the P-LDMOS device is adjacent the P-type lightly doped drain region 250 thereof.

The P-type heavily doped regions 265, 267 may be advantageously formed with an ion implantation process using dopant specie such as boron. The doping process includes a photoresist mask to define lateral dimensions of the P-type heavily doped regions 265, 267 and an annealing process at elevated temperature to properly distribute the implanted species. The P-type heavily doped region 265 for the source and drain of the PMOS device is doped, without limitation, to be greater than about $1\times10^{19}$ atoms/cm$^3$. The P-type heavily doped region 267 for the source and drain of the P-LDMOS device is doped, without limitation, to be greater than about $5\times10^{19}$ atoms/cm$^3$. Incorporating the different doping concentration profiles of the P-type heavily doped regions 265, 267 for the source and drain of the PMOS and P-LDMOS devices typically adds additional processing steps to the design thereof. It should be understood, however, that the P-type heavily doped regions 265, 267 for the source and drain of the PMOS and P-LDMOS devices may incorporate the same or analogous doping concentration profiles and still be within the broad scope of the present invention. Inasmuch as the steps of patterning, ion implanting and annealing are well known in the art, the processes will not hereafter be described in further detail.

The annealing process described above with respect to FIG. 11 inherently anneals the previously doped regions of the semiconductor device as well. As is well understood in the art, the cumulative time-temperature function for the annealing processing steps is a factor in integrated circuit design to provide proper "drive-in" of the implanted specie. The time period, temperature range and selected steps to perform the annealing processes may vary depending on an application and the desired results to form a semiconductor device incorporated into an integrated circuit. Thus, it is contemplated that the annealing processes may be performed after each ion implantation process as described herein or delayed until after several ion implantation processes and still achieve the desired results.

As mentioned above, the N-type well 225 above the N-type buried layer 220 does not cover the entire area that accommodates the P-LDMOS device in the epitaxial layer 216 of the substrate 215 between the shallow trench isolation regions 210 thereof. In particular, the N-type well 225 covers about half of the area that accommodates the P-LDMOS device through a channel region 270 that is adjacent to and extends between the P-type heavily doped region 267 of source and the P-type lightly doped drain region 250 of the drain, and under the gate 240 thereof recessed into the substrate 215 (or the overlying epitaxial layer 216). In other words, the N-type well 225 is located under and within the channel region 270, and the N-type well 225 and N-type buried layer 220 are oppositely doped in comparison to the P-type lightly and heavily doped regions 250, 267. For purposes of clarity, the channel region 270 is generally defined and well understood to be a conductive region between the source and drain (or the lightly or heavily doped regions thereof) of a transistor that is induced under the gate by a charge thereon. Thus, a doped region (e.g., a P-type doped region) 272 extends between the P-type heavily doped region 267 and the N-type well 225 of the P-LDMOS device and has a doping concentration profile less than a doping concentration profile of the P-type heavily doped region 267.

In the illustrated embodiment, the P-type doped region 272 happens to be embodied in the epitaxial layer 216 which has a doping concentration profile between $1\times10^{14}$ and $1\times10^{16}$ atoms/cm$^3$. Employing the epitaxial layer 216 as the P-type doped region 272 provides an opportunity to omit a masking and a processing step in the manufacture of the semiconductor device. Of course, the epitaxial layer 216 may be omitted and the P-type doped region 272 may be formed in the substrate 215 (in this case, a P-type doped substrate). In yet another alternative embodiment, the P-type doped region 272 may be formed by an ion implantation process prior to implanting the P-type heavily doped region 267 for the drain of the P-LDMOS device. In such a case, the P-type doping material such as boron would be implanted to provide a doping concentration profile less than a doping concentration profile of the P-type heavily doped region 267. Of course, the P-type doped region 272 may be formed with any doping concentration profile less than the P-type heavily doped region 267 including a doping concentration profile less than the P-type lightly doped drain region 250 and still be within the broad scope of the present invention.

Incorporating the P-type doped region 272 into the P-LDMOS device increases a breakdown voltage between the P-type heavily doped region 267 and the N-type well 225 of the P-LDMOS device. More specifically, in effect the P-type doped region 272 forms a parasitic diode with the adjoining oppositely doped N-type well 225. The breakdown voltage of the parasitic diode is determined by the doping concentration profiles, with lighter doping concentration profiles providing a higher breakdown voltage because the resulting internal electric fields are distributed over longer distances when the diodes are back biased. Thus, the P-LDMOS device exhibits a higher drain-to-source voltage handing capability due to the higher breakdown voltage thereof. Thus, the P-LDMOS device can handle voltages, without limitation, of ten volts while constructed on the same substrate 215 as the CMOS devices, namely, the PMOS and NMOS devices that operate at lower voltages (e.g., 2.5 volts). It should be understood that while the doped region has been described with respect to the P-LDMOS device, the principles are equally applicable to the N-LDMOS device and, for that matter, other transistors of analogous construction.

Figure 12:
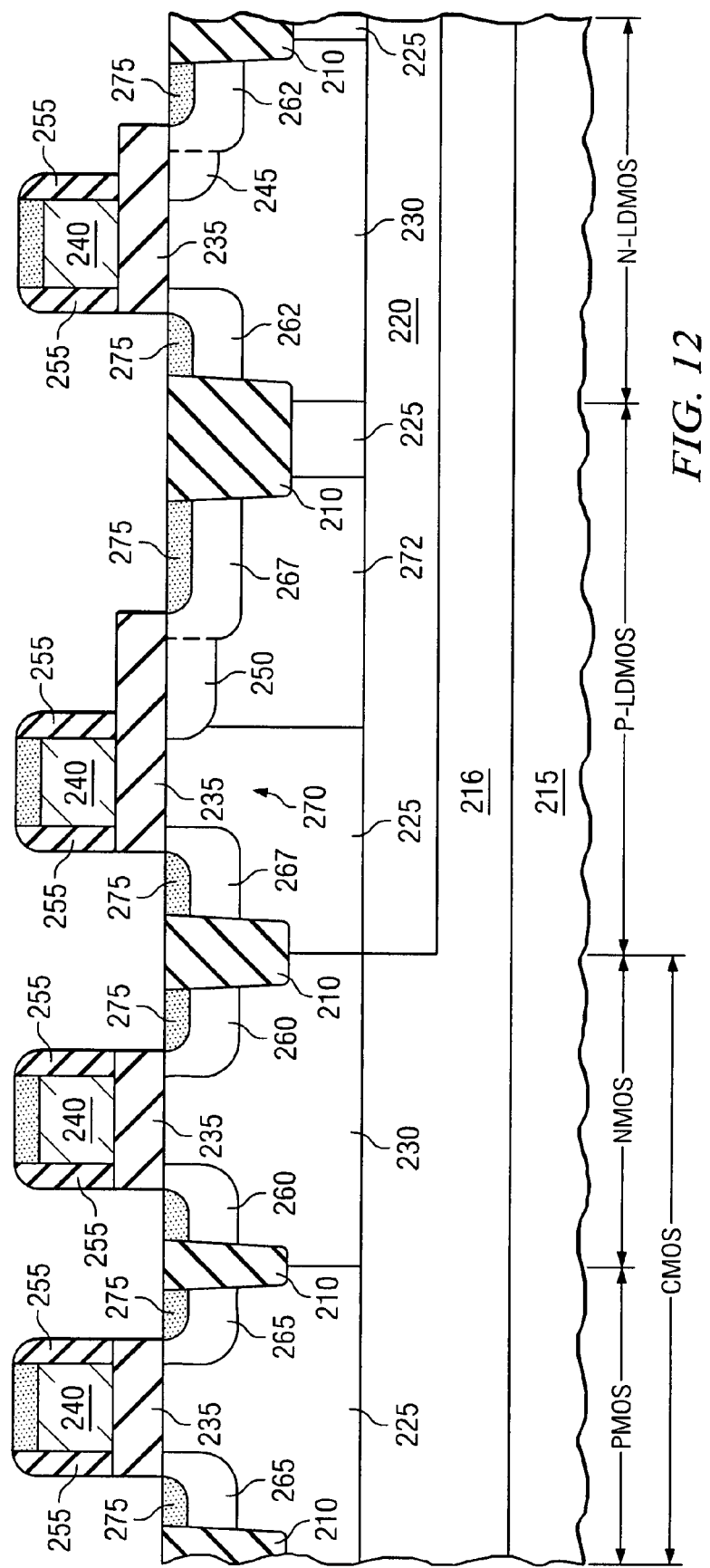

Turning now to FIG. 12, illustrated is a cross sectional view of an embodiment of a partially completed semiconductor device including a salicide layer (one of which is designated 275) on the gate, source and drain of the NMOS, PMOS, N-LDMOS and P-LDMOS devices constructed in accordance with one or more aspects of the present invention. As clearly understood by those skilled in the art, the formation of the salicide layer 275 refers to deposition of a metal over silicon by a sputtering or other deposition process followed by an annealing process to improve a conductivity of polysilicon or other material and to facilitate the formation of ohmic contacts.

First, a region for salicidation is exposed using a photoresist mask to selectively etch the gate dielectric 235 from the source and drain of the NMOS, PMOS. N-LDMOS and P-LDMOS devices. Then, a metal, generally titanium, is deposited and the substrate 215 is annealed at an elevated temperature. During the annealing process, metal in contact with silicon reacts with silicon to form the salicide layer 275. The metal not in contact with silicon remains as metal, which can be etched away, leaving behind the salicide layer 275. The steps of masking, depositing metal, annealing and etching are well known in the art and will not hereinafter be described in further detail.

Figure 13:
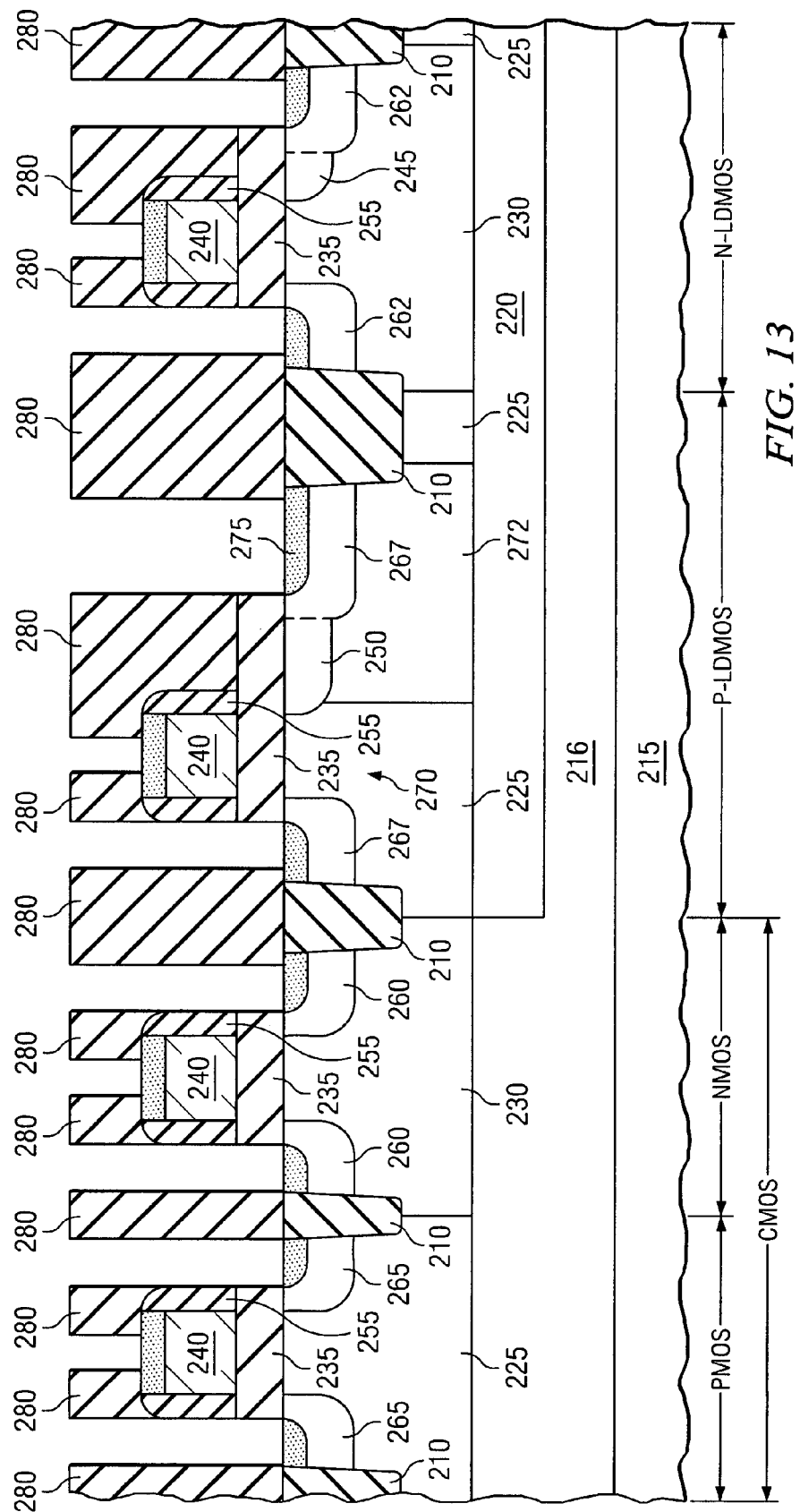

Turning now to FIG. 13, illustrated is a cross sectional view of an embodiment of a partially completed semiconductor device including dielectric regions 280 for defining metal contacts constructed in accordance with one or more aspects of the present invention. The semiconductor device is illustrated following a masking, deposition and etching of a dielectric layer to define the dielectric regions 280. The dielectric regions 280 may be formed from an oxide or other suitable dielectric material. The dielectric regions 280 are generally formed by blanket depositing the dielectric layer over the surface of the partially completed semiconductor device and anisotropically etching the dielectric layer, resulting in the dielectric regions 280. The steps of depositing the dielectric layer, masking and etching are well known in the art and will not hereinafter be described in further detail.

Figure 14:
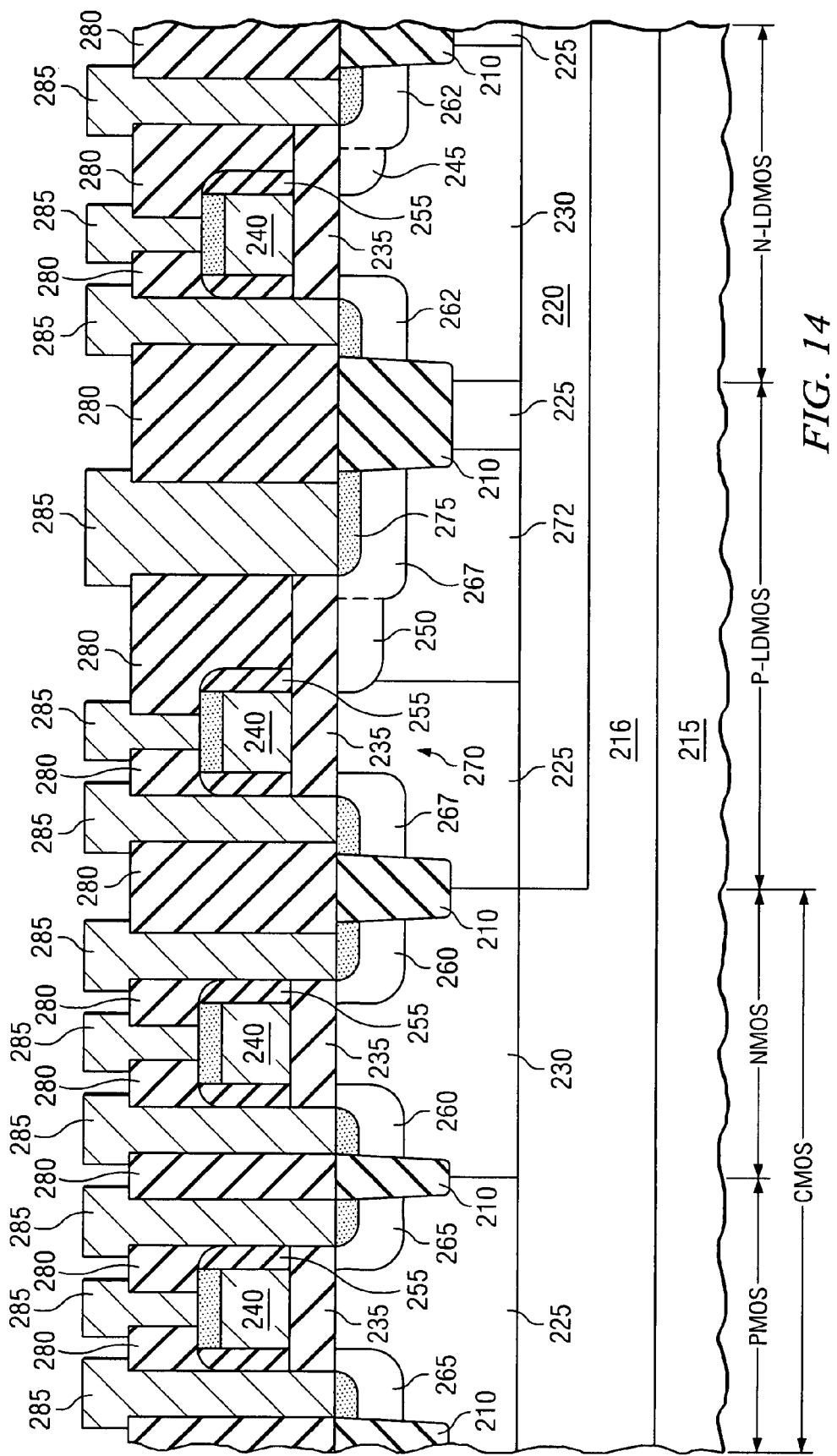

Turning now to FIG. 14, illustrated is a cross sectional view of the semiconductor device including metal (ohmic) contacts 285 formed over the salicide layer 275 on the gate, source and drain of the NMOS, PMOS, N-LDMOS and P-LDMOS devices constructed in accordance with one or more aspects of the present invention. The embodiment illustrates the semiconductor device following deposition and patterning of a metal (e.g., aluminum) for the metal contacts 285. The masking, etching, and further deposition of the dielectric and metal layers may be repeated several times to provide multiple, highly conductive layers and interconnections in accordance with the parameters of the application. For example, a four level metal interconnection arrangement may be provided by incorporating several steps to form the multi-level metal contacts 285. As illustrated, the metal contacts 285 are formed about and defined by the dielectric layers 280.

Figure 15:
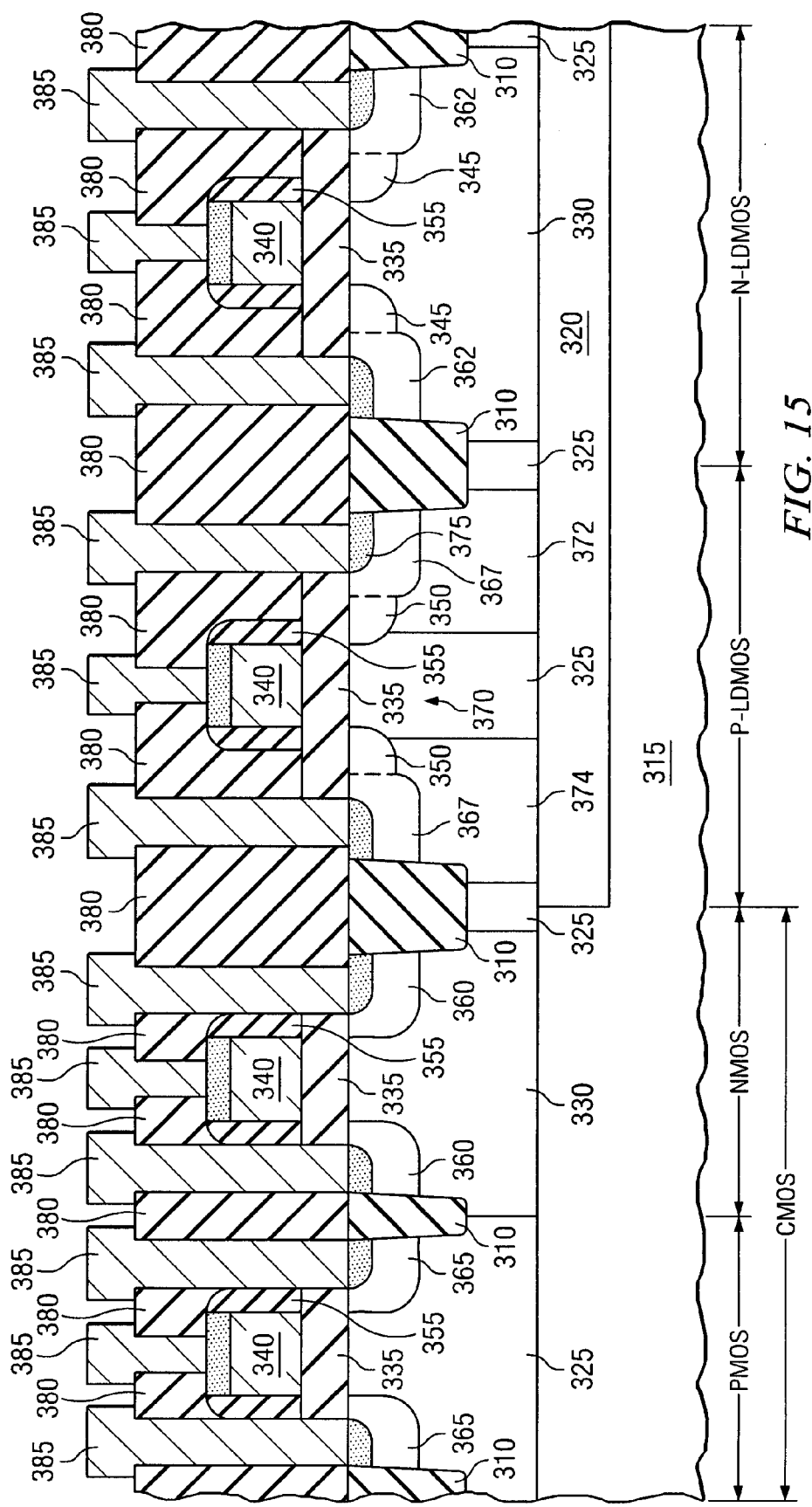
FIG. 15 illustrates a cross sectional view of another embodiment of a semiconductor device constructed according to the principles of the present invention.

Turning now to FIG. 15, illustrated is a cross sectional view of another embodiment of a semiconductor device constructed according to the principles of the present invention. Inasmuch as the processing steps to construct the semiconductor device illustrated with respect to FIG. 15 are analogous to the processing steps described above, the steps in the process will not hereinafter be described in detail. The semiconductor device includes shallow trench isolation regions 310 within a substrate 315 (e.g., P-type substrate) to provide dielectric separation between PMOS, NMOS, P-LDMOS and N-LDMOS devices. A buried layer (e.g., an N-type buried layer) 320 is recessed within the substrate 315 in the area that accommodates the P-LDMOS device and the N-LDMOS device.

The semiconductor device also includes wells (e.g., N-type wells) 325 formed in the substrate 315 in the areas that accommodate the PMOS device and the P-LDMOS device, and under the shallow trench isolation regions 310 above the N-type buried layer 320 (for the P-LDMOS). The N-type wells 325 are formed to provide electrical isolation for the PMOS device and the P-LDMOS device and operate cooperatively with the N-type buried layer 320 (in the case of the P-LDMOS device) and the shallow trench isolation regions 310 to provide the isolation. As illustrated, the N-type well 325 above the N-type buried layer 320 does not cover the entire area that accommodates the P-LDMOS device in the substrate 315 between the shallow trench isolation regions 310 thereof. The N-type well 325 for the P-LDMOS is constructed as such for the reasons as set forth herein.

The semiconductor device includes additional wells (e.g., P-type wells) 330 formed in the substrate 315 between the shallow trench isolation regions 310 substantially in the areas that accommodate the NMOS device and N-LDMOS device. While the P-type well 330 above the N-type buried layer 320 covers the entire area that accommodates the N-LDMOS device in the substrate 315 between the shallow trench isolation regions 310 thereof, it is well within the broad scope of the present invention to define the P-type well 330 to cover a portion of the area that accommodates the N-LDMOS device in the substrate 315. The semiconductor device also includes gates 340 for the PMOS, NMOS, P-LDMOS and N-LDMOS devices located over a gate dielectric layer 335 and including gate sidewall spacers 355 about the gates 340 thereof.

The N-LDMOS device includes lightly doped regions (e.g., N-type lightly doped regions) 345 for the source and the drain thereof. The P-LDMOS device also includes lightly doped regions (e.g., P-type lightly doped regions) 350 for the source and the drain thereof. In the present embodiment and for analogous reasons as stated above, the N-type and P-type lightly doped regions 345, 350 provide higher voltage sources and drains for the N-LDMOS and P-LDMOS devices, respectively. As a result, not only can the N-LDMOS and P-LDMOS devices handle higher voltages from the drain-to-source thereof, but the devices can handle a higher voltage from a source-to-gate thereof when the source is more positive than the gate 340. It is recognized that the width of the N-type and P-type lightly doped regions 345, 350 may be individually varied to alter the breakdown voltage characteristics of the respective N-LDMOS and P-LDMOS devices without departing from the scope of the present invention. Additionally, the N-type and P-type lightly doped regions may be formed in a manner similar to the respective N-LDMOS and P-LDMOS devices illustrated and described with respect to FIGS. 2 through 14.

The semiconductor device also includes heavily doped regions (e.g., N-type heavily doped regions) 360 for the source and drain of the NMOS device that preferably have a different doping concentration profile than heavily doped regions (e.g., N-type heavily doped regions) 362 for the source and drain of the N-LDMOS device. The N-type heavily doped regions 360 for the NMOS device are formed within the P-type well 330 thereof and, as alluded to above, form the source and the drain for the NMOS device. Additionally, the N-type heavily doped regions 362 for the N-LD- MOS device are formed within the P-type well 330 thereof and, as alluded to above, form a portion of the source and the drain for the N-LDMOS device. Also, the N-type heavily doped regions 362 of the source and drain for the N-LDMOS device are adjacent the N-type lightly doped drain regions 345 thereof.

The semiconductor device also includes heavily doped regions (e.g., P-type heavily doped regions) 365 for the source and drain of the PMOS device that preferably have a different doping concentration profile than heavily doped regions (e.g., P-type heavily doped regions) 367 for the source and drain of the P-LDMOS device. The P-type heavily doped regions 365 for the PMOS device are formed within the N-type well 325 thereof and, as alluded to above, form the source and the drain for the PMOS device. Additionally, the P-type heavily doped regions 367 for the P-LDMOS device are formed within the N-type well 325 or in regions adjacent the N-type well 325 thereof and, as alluded to above, form a portion of the source and the drain for the P-LDMOS device. Also, the P-type heavily doped regions 367 of the source and drain for the P-LDMOS device are adjacent the P-type lightly doped drain regions 350 thereof.

In the illustrated embodiment, the N-type well 325 above the N-type buried layer 320 does not cover the entire area that accommodates the P-LDMOS device in the substrate 315 between the shallow trench isolation regions 310 thereof. In particular, the N-type well 325 is located under and within a channel region 370, and the N-type well 325 and N-type buried layer 320 are oppositely doped in comparison to the P-type lightly and heavily doped regions 350, 367. Thus, doped regions (e.g., a P-type doped regions; also generally referred to as a "doped region and another doped region") 372, 374 extend between the P-type heavily doped regions 367 and the N-type well 325 of the P-LDMOS device and have a doping concentration profile less than a doping concentration profile of the P-type heavily doped regions 367. While the P-type heavily doped regions 367 preferably have the same doping concentration profiles, it is well within the broad scope of the present invention that the P-type heavily doped region 367 for the source has a different doping concentration profile than the counterpart of the drain. The same principle applies to other like regions of the devices of the semiconductor device.

In the illustrated embodiment, the P-type doped regions 372, 374 happen to be embodied in the substrate 315 which has a doping concentration profile between $1\times10^{14}$ and $1\times10^{16}$ atoms/cm$^3$. Employing the substrate 315 as the P-type doped regions 372, 374 provides an opportunity to omit a masking and a processing step in the manufacture of the semiconductor device. In yet another alternative embodiment, the P-type doped regions 372, 374 may be formed by an ion implantation process prior to implanting the P-type heavily doped regions 367 for the source and the drain of the P-LDMOS device. Of course, the P-type doped regions 372, 374 may be formed with any doping concentration profile less than the P-type heavily doped regions 367.

Incorporating the P-type doped regions 372, 374 into the P-LDMOS device further increases a breakdown voltage between the P-type heavily doped regions 367 and the N-type well 325 of the P-LDMOS device. The P-LDMOS device, therefore, exhibits a higher drain-to-source voltage handing capability due to the higher breakdown voltage thereof and provides a higher source-to-gate voltage handling capability when the source is more positive than the gate 340. It should be understood that while the doped regions have been described with respect to the P-LDMOS device, the principles are equally applicable to the N-LDMOS device and, for that matter, other transistors of analogous construction.

Additionally, whereas the P-LDMOS and N-LDMOS devices illustrated and described with respect to FIGS. 2 through 14 are referred to as asymmetrical devices, the P-LDMOS and N-LDMOS devices illustrated and described with respect to FIG. 15 are referred to as symmetrical devices. In other words, the symmetrical nature of the source and drain of the semiconductor device of FIG. 15 provide for a symmetrical device. Of course, those skilled in the art should understand that the dimensions of the source and drain (including the lightly and heavily dope regions thereof) may vary and still fall within the broad scope of the present invention. The semiconductor device also includes metal contacts 385 defined by dielectric regions 380 formed over salicide layers (one of which is designated 375) for the gate, source and drain of the PMOS, NMOS, P-LDMOS and N-LDMOS devices.

The development of a semiconductor device as described herein retains the fine line structures and accommodates an operation at higher voltages and with higher switching frequencies (e.g., five megahertz). By introducing a doped region(s) between the heavily doped region and oppositely doped well, the LDMOS device exhibits a high voltage handling capability from the drain to the source thereof. At the same time, the higher voltage device is constructed employing a limited number of additional processing steps. Moreover, the LDMOS device may exhibit a low level gate-to-source voltage limit (e.g., 2.5 volts) and at the same time handle drain-to-source voltages above the gate-to-source voltage limit thereof. Alternatively, the LDMOS device may exhibit a higher level source-to-gate voltage handling capability (e.g., five volts) when the source is more positive than the gate and at the same time handle drain-to-source voltages above the low level gate-to-source voltage limit thereof. In other words, the LDMOS device can switch the larger currents normally associated with a power train of a power converter by appropriately designing selected regions thereof as set forth above.

Thus, a transistor (e.g., a LDMOS device) and related method of constructing the same with readily attainable and quantifiable advantages has been introduced. Those skilled in the art should understand that the previously described embodiments of the LDMOS device, semiconductor device and related methods of constructing the same are submitted for illustrative purposes only. In addition, other embodiments capable of producing a higher voltage device such as a LDMOS device that can accommodate higher voltages and is capable of being integrated with low voltage devices on a semiconductor substrate in an integrate circuit that may form a power converter or portions thereof are well within the broad scope of the present invention.

In an advantageous embodiment, the LDMOS device and semiconductor device may be incorporated into an integrated circuit that forms a power converter or the like. Alternatively, the semiconductor device may be incorporated into an integrated circuit that forms another system such as a power amplifier, motor controller, and a system to control an actuator in accordance with a stepper motor or other electromechanical device.

For a better understanding of integrated circuits, semiconductor devices and methods of manufacture therefor see "Semiconductor Device Fundamentals," by R. F. Pierret, Addison-Wesley (1996); "Handbook of Sputter Deposition Technology," by K. Wasa and S. Hayakawa, Noyes Publications (1992); "Thin Film Technology," by R. W. Berry, P. M. Hall and M. T. Harris, Van Nostrand (1968); "Thin Film Processes," by J. Vossen and W. Kern, Academic (1978); and "Handbook of Thin Film Technology," by L. Maissel and R. Glang, McGraw Hill (1970). For a better understanding of power converters, see "Modern DC-to-DC Switchmode Power Converter Circuits," by Rudolph P. Sevems and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a transistor, comprising:
   providing a semiconductor substrate;
   forming a gate on said semiconductor substrate;
   forming a source/drain by:
      forming a lightly doped region adjacent a channel region recessed into said semiconductor substrate, and
      forming a heavily doped region adjacent said lightly doped region;
   forming an oppositely doped well under and within said channel region; and
   forming a doped region between said heavily doped region and said oppositely doped well without surrounding said lightly doped region, said doped region having a doping concentration profile less than a doping concentration profile of said heavily doped region.

2. The method as recited in claim 1 further comprising forming an oppositely doped buried layer recessed into said substrate.

3. The method as recited in claim 1 further comprising forming an epitaxial layer over said semiconductor substrate, said doped region being formed from said epitaxial layer.

4. The method as recited in claim 1 wherein said source/drain includes P-type lightly and heavily doped regions and said oppositely doped well is an N-type well, said doped region being a P-type doped region having a doping concentration profile less than a doping concentration profile of said P-type heavily doped region.

5. The method as recited in claim 1, further comprising:
   forming another source/drain by:
      forming a lightly doped region located adjacent said channel region, and
      forming a heavily doped region located adjacent said lightly doped region; and
   forming another doped region between said heavily doped region of said another source/drain and said oppositely doped well, said another doped region having a doping concentration profile less than a doping concentration profile of said heavily doped region of said another source/drain.

6. The method as recited in claim 1, further comprising:
   forming a gate dielectric layer over said semiconductor substrate;
   forming gate sidewall spacers about said gate;
   forming a salicide layer on said gate and said source/drain; and
   forming metal contacts over said salicide layer on said gate and said source/drain.

7. The method as recited in claim 1 wherein said heavily doped region is adjacent to but not surrounded by said lightly doped region.

8. The method as recited in claim 1 wherein said heavily doped region is located on a side opposite said channel region to said lightly doped region.

9. The method as recited in claim 1 further comprising forming an isolation region adjacent said heavily doped region opposite said lightly doped region within said semiconductor substrate.

10. The method as recited in claim 1 wherein said doping concentration profile of said doped well is different from a doping concentration profile of said lightly doped region.

* * * * *

UNITED STATES PATENT AND TRADEMARK OFFICE
CERTIFICATE OF CORRECTION

PATENT NO. : 7,759,184 B2  Page 1 of 1
APPLICATION NO. : 11/805233
DATED : July 20, 2010
INVENTOR(S) : Lotfi et al.

It is certified that error appears in the above-identified patent and that said Letters Patent is hereby corrected as shown below:

In Col. 2, line 7, after such insert --as--.
In Col. 2, line 62, delete "handing" and insert --handling--.
In Col. 8, line 13, delete "atoms/cm3" and insert --atoms/cm$^3$--.
In Col. 8, line 46, delete "atoms/cm3" and insert --atoms/cm$^3$--.
In Col. 12, line 62, delete "handing" and insert --handling--.
In Col. 15, line 62, delete "handing" and insert --handling--.
In Col. 16, line 12, delete "dope" and insert --doped--.
In Col. 16, line 49, delete "integrate" and insert --integrated--.
In Col. 17, line 4, delete "Sevems" and insert --Severns--.

Signed and Sealed this

Ninth Day of November, 2010

David J. Kappos
*Director of the United States Patent and Trademark Office*